US011444016B2

(12) United States Patent
Lin et al.

(10) Patent No.: US 11,444,016 B2
(45) Date of Patent: Sep. 13, 2022

(54) NON-VOLATILE MEMORY WITH CAPACITORS USING METAL UNDER SIGNAL LINE OR ABOVE A DEVICE CAPACITOR

(71) Applicant: SANDISK TECHNOLOGIES LLC, Addison, TX (US)

(72) Inventors: Luisa Lin, Redwood City, CA (US); Mohan Dunga, Santa Clara, CA (US); Venkatesh P. Ramachandra, San Jose, CA (US); Peter Rabkin, Cupertino, CA (US); Masaaki Higashitani, Cupertino, CA (US)

(73) Assignee: SanDisk Technologes LLC, Addison, TX (US)

( * ) Notice: Subject to any disclaimer, the term of this patent is extended or adjusted under 35 U.S.C. 154(b) by 159 days.

(21) Appl. No.: 16/886,695

(22) Filed: May 28, 2020

(65) Prior Publication Data

US 2020/0294909 A1    Sep. 17, 2020

Related U.S. Application Data

(62) Division of application No. 16/168,232, filed on Oct. 23, 2018, now Pat. No. 10,847,452.

(Continued)

(51) Int. Cl.
*H01L 27/115* (2017.01)
*H01L 27/06* (2006.01)
*H01L 23/522* (2006.01)
*H01L 23/528* (2006.01)
*H01L 23/00* (2006.01)

(Continued)

(52) U.S. Cl.
CPC ...... *H01L 23/5223* (2013.01); *H01L 23/5283* (2013.01); *H01L 23/5286* (2013.01); *H01L 24/05* (2013.01); *H01L 27/11582* (2013.01); *H01L 28/60* (2013.01); *H01L 2224/05025* (2013.01)

(58) Field of Classification Search
CPC ..... H01L 28/60; H01L 28/86; H01L 23/5223; H01L 23/5286; H01L 27/11582; H01L 27/0629
See application file for complete search history.

(56) References Cited

U.S. PATENT DOCUMENTS 4,777,518 A    10/1988    Mihara
4,875,083 A    10/1989    Palmour
(Continued)

OTHER PUBLICATIONS

Office Action dated Jan. 30, 2020, U.S. Appl. No. 16/168,168.
(Continued)

*Primary Examiner* — Omar F Mojaddedi
(74) *Attorney, Agent, or Firm* — Vierra Magen Marcus LLP

(57) ABSTRACT

A non-volatile storage apparatus comprises a non-volatile memory structure and a plurality of I/O pads in communication with the non-volatile memory structure. The I/O pads include a power I/O pad, a ground I/O pad and data/control I/O pads. The non-volatile storage apparatus further comprises one or more capacitors connected to the power I/O pad and the ground I/O pad. The one or more capacitors are positioned in one or more metal interconnect layers below the signal lines and/or above device capacitors on the top surface of the substrate.

12 Claims, 23 Drawing Sheets

Related U.S. Application Data

(60) Provisional application No. 62/694,293, filed on Jul. 5, 2018.

(51) Int. Cl.
    *H01L 49/02*      (2006.01)
    *H01L 27/11582*      (2017.01)

(56) References Cited

U.S. PATENT DOCUMENTS

| | | | |
|---|---|---|---|
| 5,893,734 | A | 4/1999 | Jeng |
| 5,978,271 | A | 11/1999 | Sato |
| 6,346,454 | B1 | 2/2002 | Sung |
| 6,426,249 | B1 | 7/2002 | Geffken |
| 8,643,142 | B2 | 2/2014 | Higashitani |
| 8,951,859 | B2 | 2/2015 | Higashitani |
| 10,163,480 | B1 | 12/2018 | Kawamura |
| 2003/0184360 | A1 | 10/2003 | Wang |
| 2009/0085154 | A1* | 4/2009 | Herner ............... H01L 27/1021 |
| | | | 257/E21.613 |
| 2013/0154055 | A1 | 6/2013 | Park |
| 2014/0264739 | A1* | 9/2014 | Morrow ............. H01L 23/5286 |
| | | | 257/532 |
| 2016/0276265 | A1* | 9/2016 | Iwabuchi ............... H01L 28/60 |
| 2017/0018570 | A1* | 1/2017 | Lue ........................ H01L 28/60 |
| 2019/0035441 | A1* | 1/2019 | Bedeschi .............. G11C 11/408 |
| 2019/0138893 | A1* | 5/2019 | Sharma ............ H01L 27/11502 |
| 2020/0013794 | A1 | 1/2020 | Dunga |
| 2020/0013795 | A1 | 1/2020 | Dunga |

OTHER PUBLICATIONS

Response to Office Action dated Apr. 16, 2020, U.S. Appl. No. 16/168,168.
Notice of Allowance dated May 6, 2020, U.S. Appl. No. 16/168,168.
Office Action dated Aug. 1, 2019, U.S. Appl. No. 16/168,232.
Response to Office Action dated Aug. 16, 2019, U.S. Appl. No. 16/168,232.
Office Action dated Jan. 8, 2020, U.S. Appl. No. 16/168,232.
Response to Office Action dated Mar. 19, 2020, U.S. Appl. No. 16/168,232.
Notice of Allowance dated Apr. 2, 2020, U.S. Appl. No. 16/168,232.
Lin, et al., U.S. Patent Application titled "Non-Volatile Memory With Capacitors Using Metal Under Signal Line or Above a Device Capacitor," filed same day as this application.
Lin, et al., "Non-Volatile Memory With Capacitors Using Metal Under Signal Line or Above a Device Capacitor," U.S. Appl. No. 16/886,702, filed May 28, 2020.
Restriction Office Action dated Jan. 5, 2022, U.S. Appl. No. 16/886,702.
Response to Restriction Office Action dated Jan. 18, 2022, U.S. Appl. No. 16/886,702.
Office Action dated Feb. 3, 2022, U.S. Appl. No. 16/886,702.
Response to Office Action dated Apr. 13, 2022, U.S. Appl. No. 16/886,702.
Final Office Action dated Apr. 26, 2022, U.S. Appl. No. 16/886,702.

\* cited by examiner

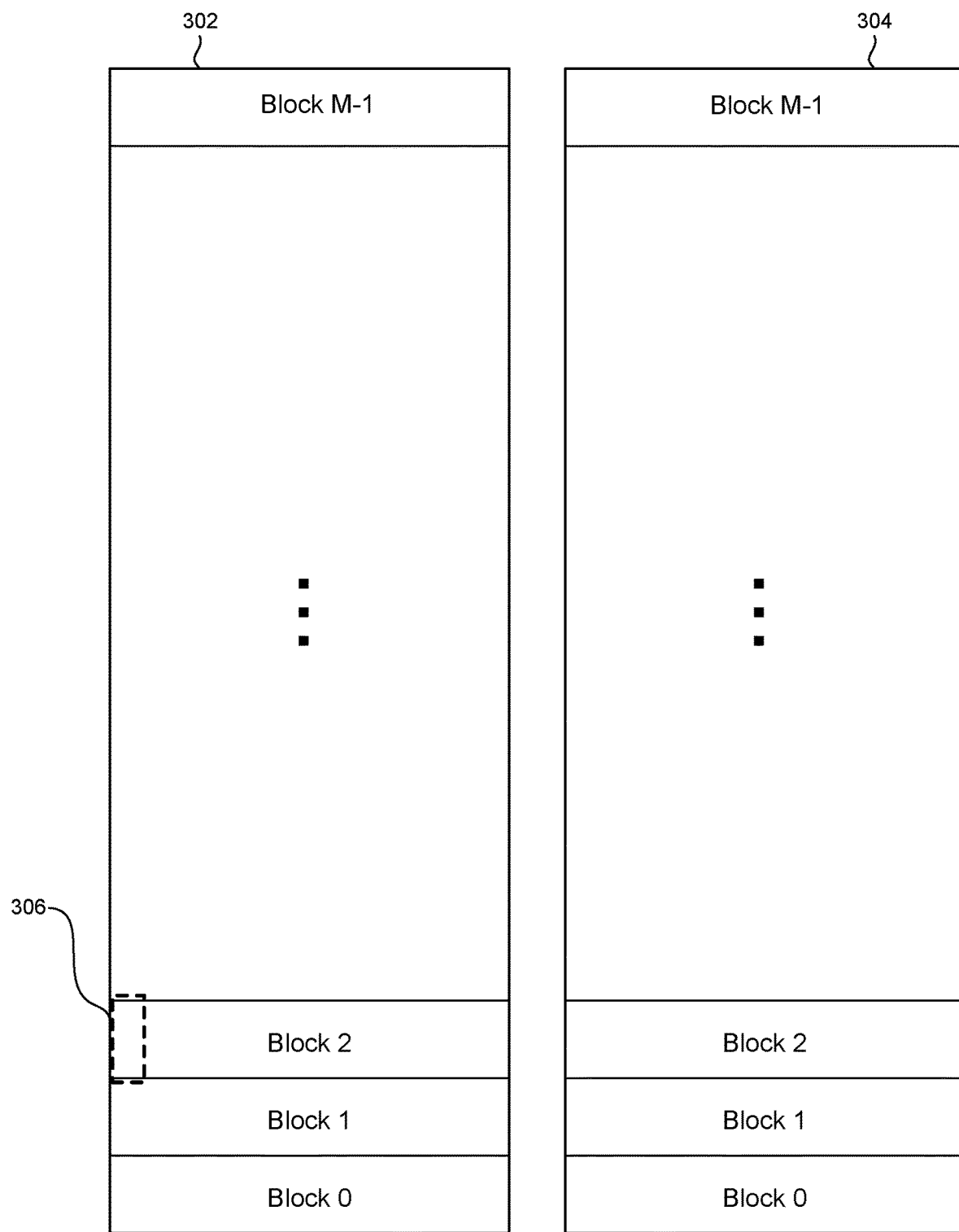

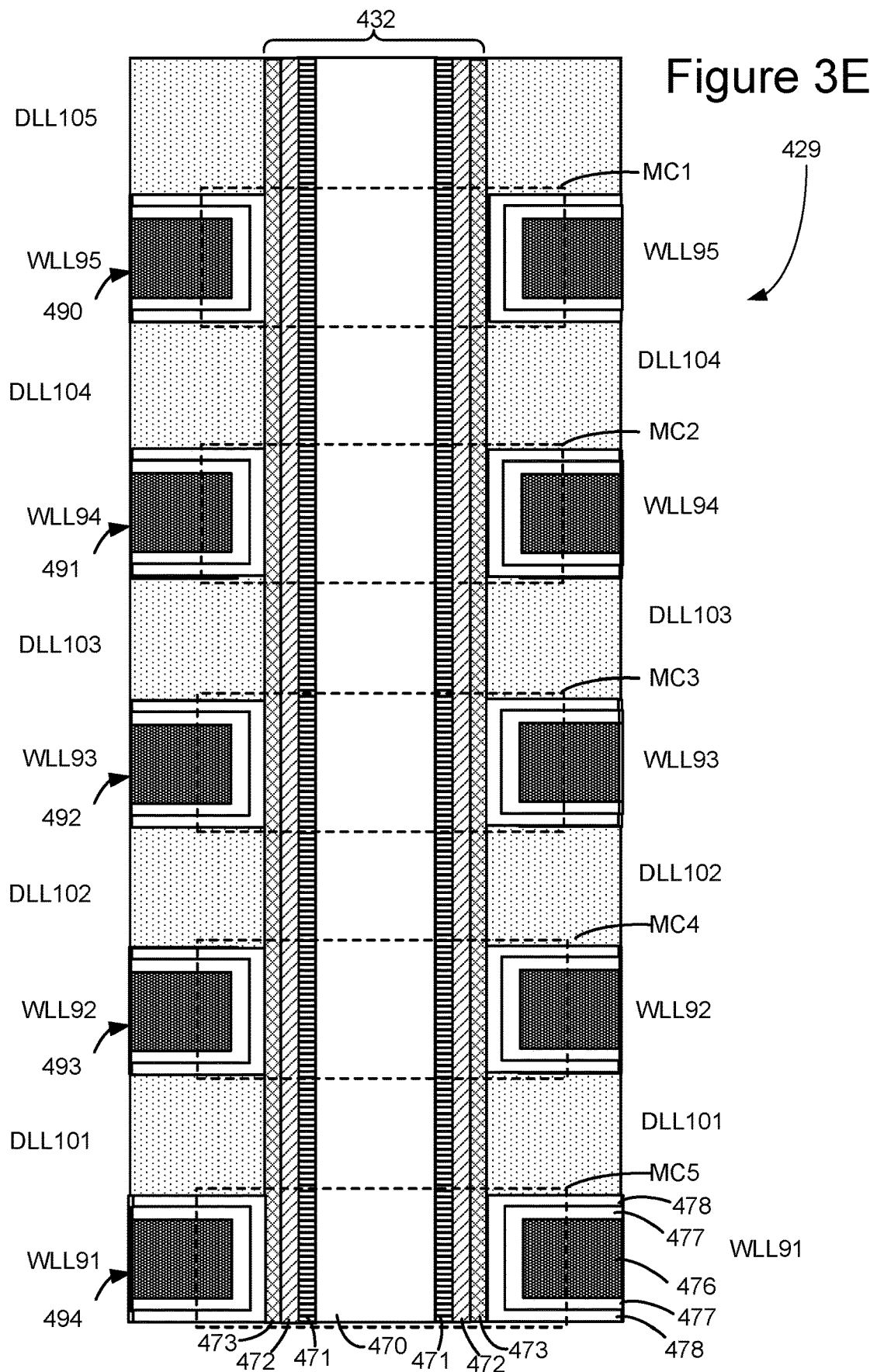

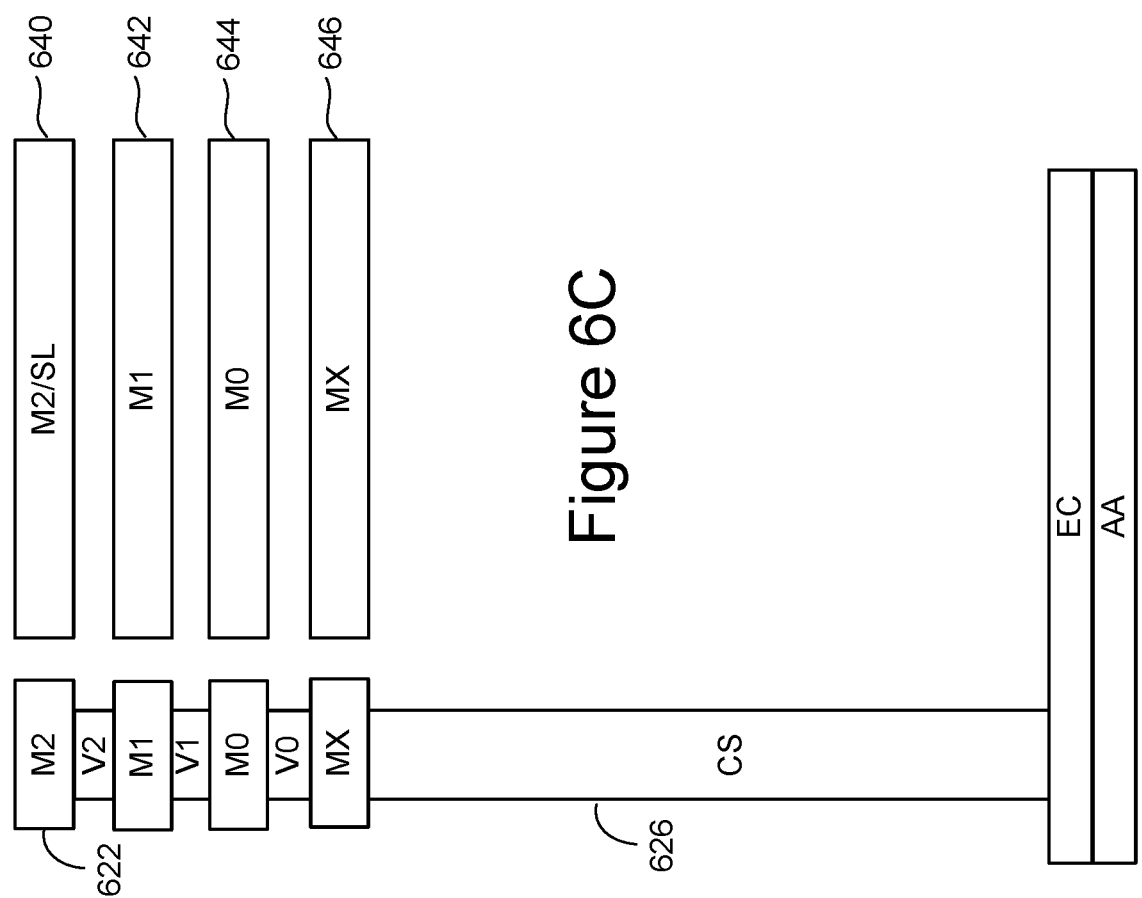

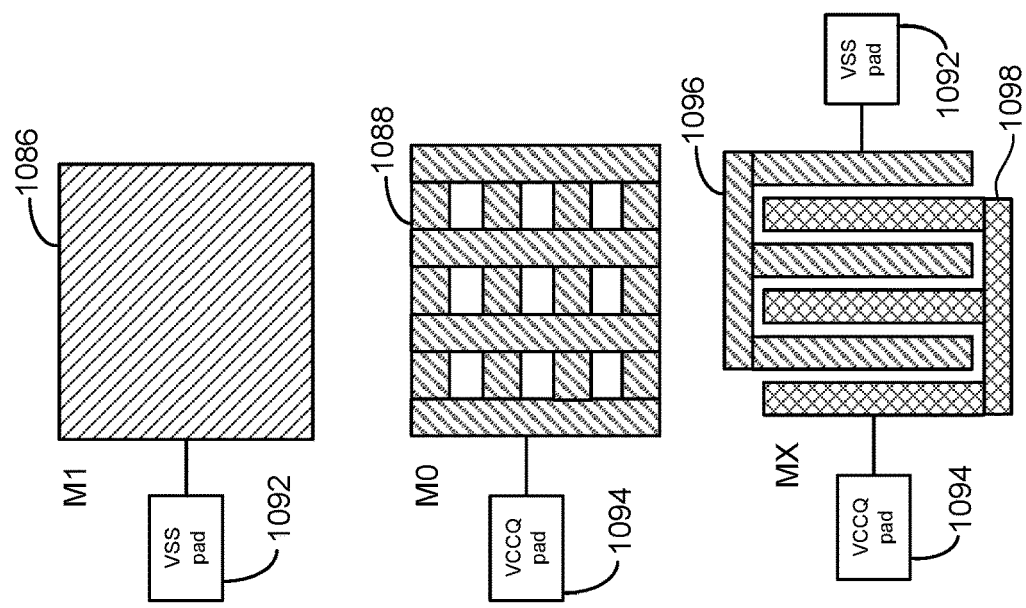
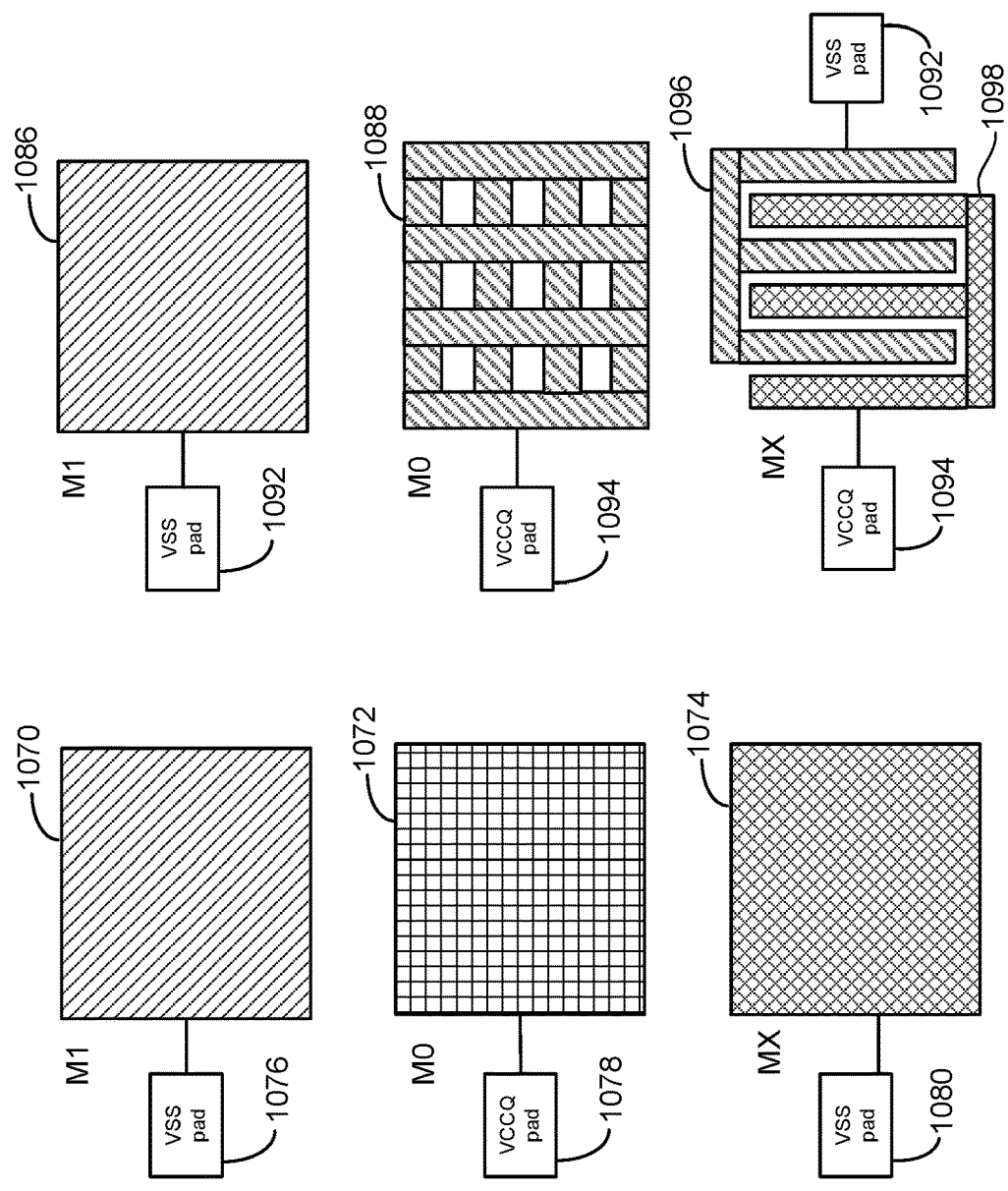
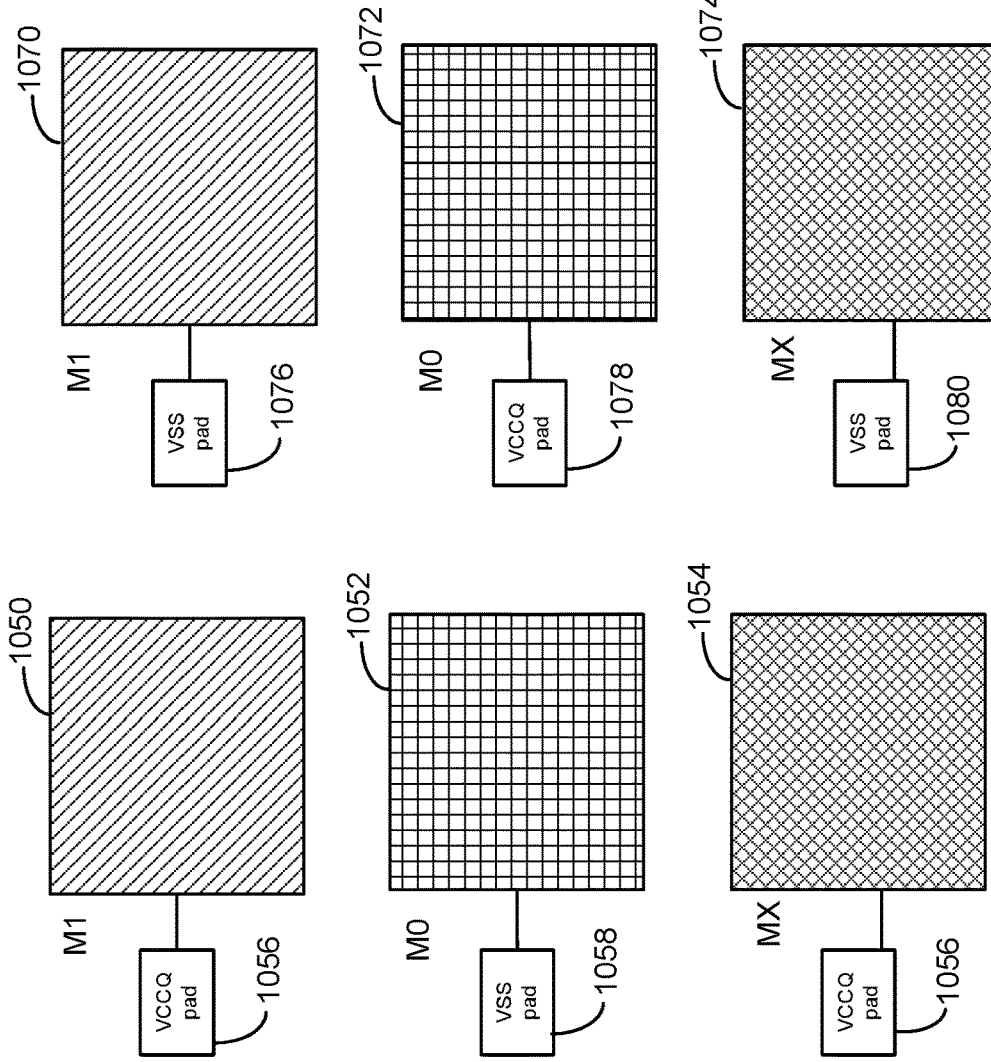

NON-VOLATILE MEMORY WITH CAPACITORS USING METAL UNDER SIGNAL LINE OR ABOVE A DEVICE CAPACITOR

The application claims priority to Provisional Application 62/694,293, filed on Jul. 5, 2018, titled "Non-Volatile Memory With Capacitors Using Metal Under Powerline or above Device Cap," incorporated herein by reference in its entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. It is important that the memory system function properly so that data can be stored in the memory system and read back accurately.

BRIEF DESCRIPTION OF THE DRAWINGS

Like-numbered elements refer to common components in the different figures.

FIG. 3A is a block diagram of a memory structure having two planes.

FIG. 3E is a cross sectional view of a vertical column of memory cells.

FIG. 6C is a cross sectional view of a portion of a memory die.

FIG. 9F is a top view of three metal layers, each of which includes a metal plate.

FIG. 9G is a top view of three metal layers, each of which includes a metal plate.

FIG. 9H is a top view of three metal layers, including a metal plate, a mesh shaped metal component and a pair of interleaved combs.

DETAILED DESCRIPTION

Figure 1:
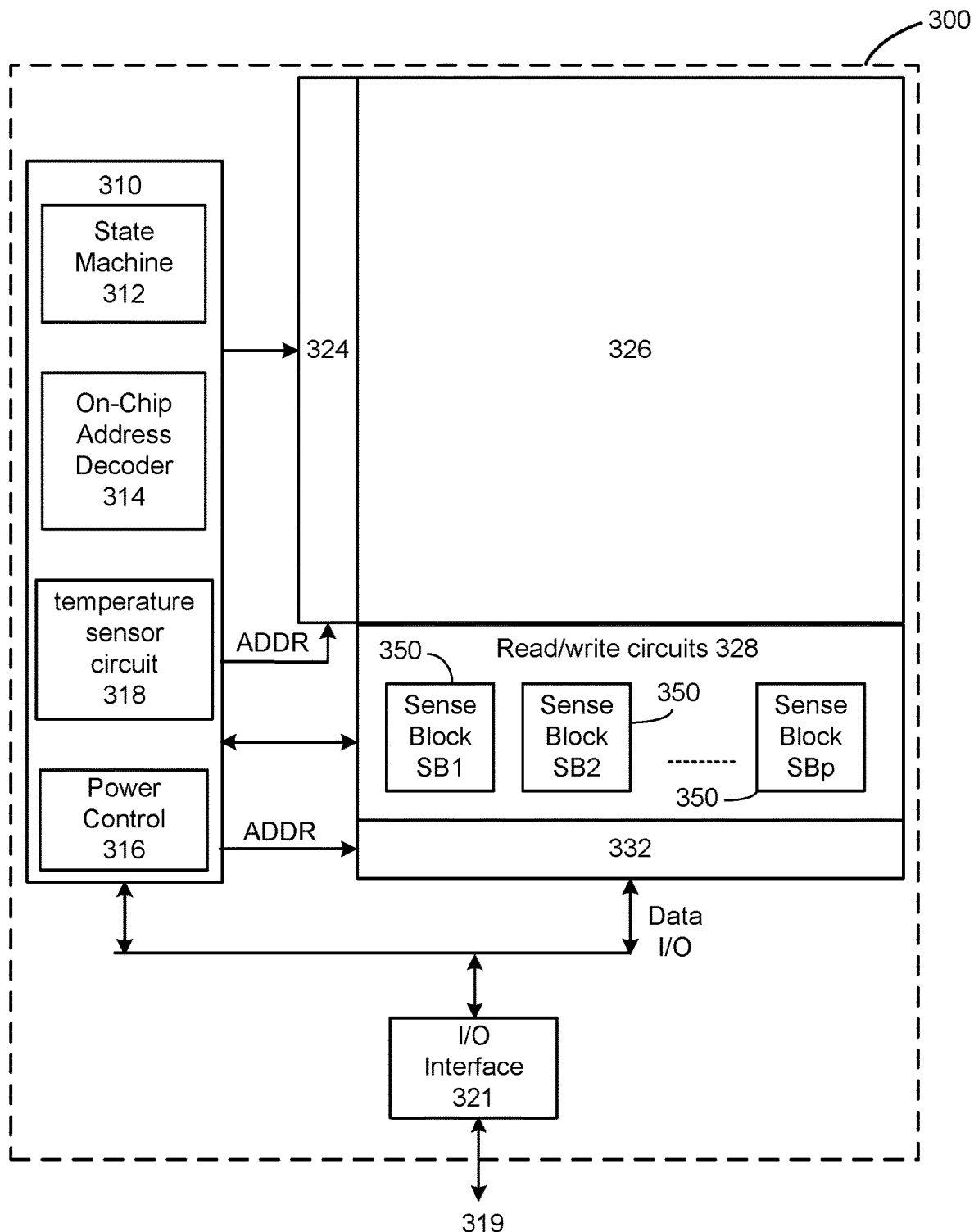
FIG. 1 is a block diagram of one embodiment of a memory die.

A memory die is a semiconductor die that has a memory system implemented thereon. Typically, a memory die has a memory structure, peripheral circuits connected to the memory structure and an Input/Output ("I/O") interface connected to the peripheral circuits and the memory structure. For purposes of this document, an I/O interface is a structure that serves as the point where signals inside the memory die meet signals outside the memory die. One embodiment of an I/O interface includes a set of I/O pads, which allow signals internal to the memory die to connect to the world outside of the memory die. In some examples, the I/O pads are connected to I/O pins of a package or to wires. In some embodiments of a memory die, the set of I/O pads of the I/O interface includes data/control I/O pads for data signals and/or control signals, power I/O pads for power, and ground I/O pads to connect to ground.

Due to active switching of the inputs and outputs of a memory die, there can be large swings in current on a power I/O pad. This change in the current on the power I/O pad can lead to distortion of other signals. For example, some memory die have a clock I/O pad, for a synchronization clock signal. The change in the current on the power I/O pad can lead to distortion of the synchronization clock signal so that the duty cycle of the synchronization clock signal is altered in a manner that prevents the synchronization clock signal from reliably synchronizing components.

In order to solve the problem associated with large swings in current on a power I/O pad, it is proposed to connect the power I/O pad to one or more capacitors. However, simply adding capacitors to the memory die may cause the memory die to increase in size, which is not desired since there is a demand for smaller memory die for smaller electronic devices. Thus, it is proposed to convert unused portions of the memory die to usable pool capacitors for the power I/O pad. This technology can also be used to provide capacitors for other I/O pads or other types of I/O interfaces. Additionally, the proposed technology can be used on semiconductors dies other than memory dies.

For example it is proposed to add capacitors to the memory die by positioning these capacitors in one or more metal interconnect layers (that are otherwise not being used) below a signal line and/or above a device capacitor.

One embodiment includes a die (e.g., a memory die) having an electrical circuit, a plurality of metal interconnect layers connected to the electrical circuit, a signal line connected to the electrical circuit, a plurality of I/O connections in communication with the electrical circuit, and one or more capacitors positioned in one or more of the metal interconnect layers below the signal line. Some implementations of the die include device capacitors formed on the top surface of the substrate such that the one or more capacitors are positioned above the device capacitors formed on the top surface of the substrate.

FIG. 1 is a functional block diagram of one embodiment of a memory die 300 that implements the technology proposed herein for using a portion of memory die as pool capacitors for the I/O interface. The components depicted in FIG. 1 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers.

Memory dies 300 includes I/O interface 321, which is connected to control circuitry 310, column decoder 332, read/write circuits 328 and memory structure 326. Commands and data are transferred between the controller and the memory die 300 via lines 319 that connect to I/O interface 321. In one embodiment, I/O interface 321 includes a set of I/O pads.

I/O interface 321 can be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal. Table 1 provides a definition of one example of a Toggle Mode Interface that can be used to implement I/O interface 321. For each of the signals listed in the table below, I/O Interface has a corresponding I/O pad.

TABLE 1

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |

TABLE 1-continued

| Signal Name | Type | Function |
| --- | --- | --- |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| DQSn | Input/Output | Data Strobe complement (used for DDR) |
| Bus [0:7] | Input/Output | Data Input/Output (I/O) bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals |
| VPP | Supply | Optional, high voltage, external power supply |
| VREF | Supply | Reference voltage, reserved fir Toggle Mode DDR2 |
| VSS | Supply | Ground |

As described above, due to active switching of the inputs and outputs of I/O Interface 321, there can be large swings in current on VCCQ. This change in the current on the VCCQ can lead to distortion of other signals such as DQS. The signal DQS is supposed to have a 50% duty cycle, but due to large swings in current on VCCQ, the duty cycle may be different than 50%, which can cause a signaling problem that prevents proper communication between the memory die and controller. In order to solve this problem, it is proposed to connect the power I/O pad (e.g. the I/O pad for VCCQ or VCC) to one or more pool capacitors. However, simply adding capacitors to the memory die may cause the memory die to increase in size, which is not desired since there is a demand for smaller memory die for smaller electronic devices. Thus, it is proposed to convert unused portions of the memory die to usable pool capacitors for the power I/O pad.

Looking back at FIG. 1, control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit.

In one embodiment, memory structure 326 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
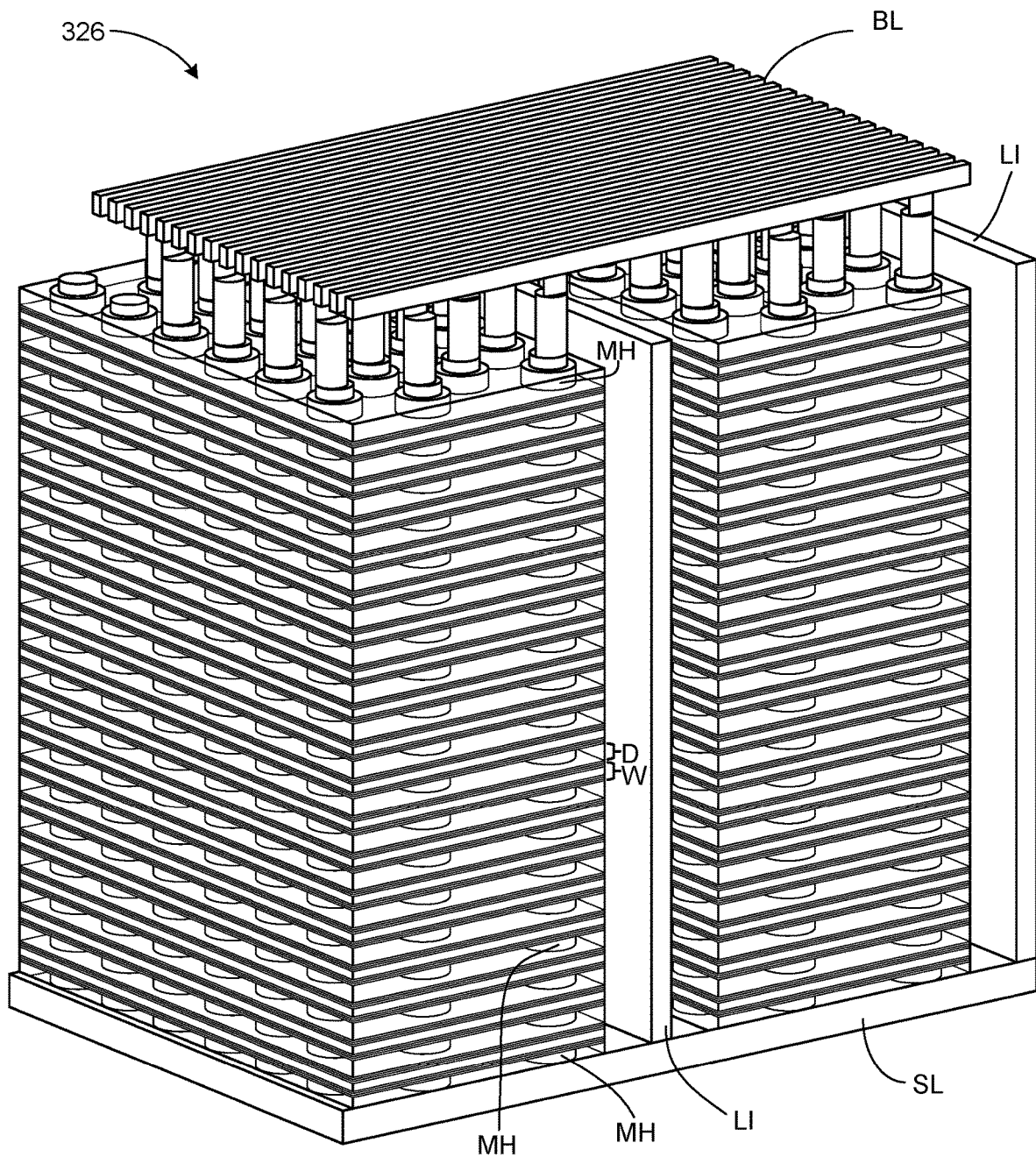
FIG. 2 is a perspective view of a portion of one embodiment of a monolithic three dimensional memory structure.

FIG. 2 is a perspective view of a portion of one example embodiment of a monolithic three dimensional memory array that can comprise memory structure 326, which includes a plurality non-volatile memory cells. For example, FIG. 2 shows a portion of one block of memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" or sub-blocks by local interconnects LI. FIG. 2 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 2, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data. More details of the three dimensional monolithic memory array that comprises memory structure 126 is provided below with respect to FIG. 3A-3F.

FIG. 3A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In one embodiment, a block represents a groups of connected memory cells as the memory cells of a block share a common set of unbroken word lines and unbroken bit lines. In the structure of FIG. 3A, Block 0 and Block M-1 of both planes 302 and 304 are at the edge of the memory structure (or otherwise referred to as being located in an edge region/section of the memory structure).

Figure 3B:
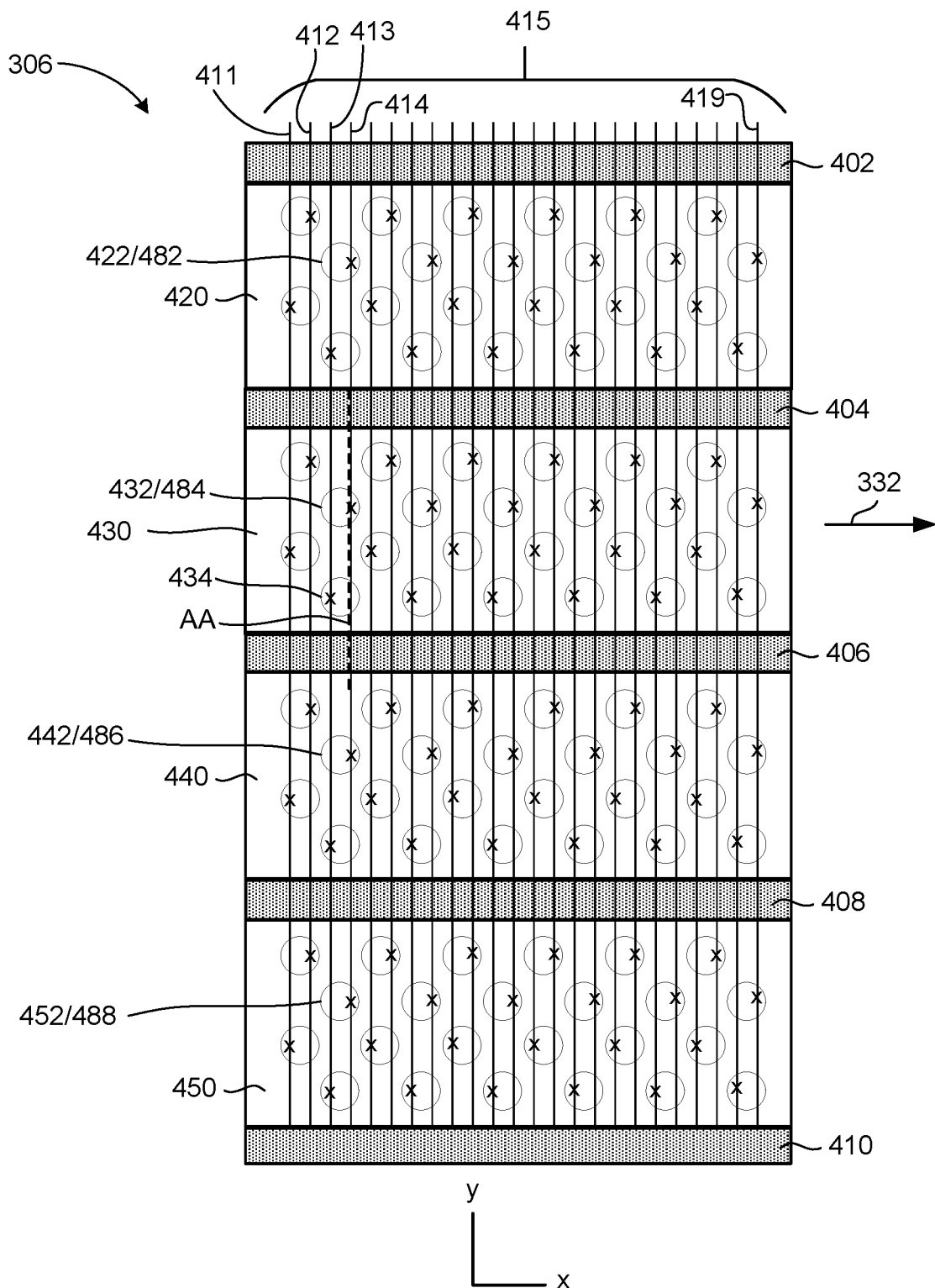
FIG. 3B depicts a top view of a portion of a block of memory cells.

FIGS. 3B-3F depict an example three dimensional ("3D") NAND structure that corresponds to the structure of FIG. 2 and can be used to implement memory structure 326 of FIG. 1. FIG. 3B is a block diagram depicting a top view of a portion of one block from memory structure 326. The portion of the block depicted in FIG. 3B corresponds to portion 306 in block 2 of FIG. 3A. As can be seen from FIG. 3B, the block depicted in FIG. 3B extends in the direction of 332. In one embodiment, the memory array has many layers; however, FIG. 3B only shows the top layer.

FIG. 3B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 3B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 3B extends in the direction of arrow 330 and in the direction of arrow 332, the block includes more vertical columns than depicted in FIG. 3B

FIG. 3B also depicts a set of bit lines 415, including bit lines 411, 412, 413, 414, . . . 419. FIG. 3B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452. In some embodiments, bit lines are positioned over the memory structure 325 and run along the entire length of the plane (e.g., from the top of plane 302 to the bottom of plane 302).

The block depicted in FIG. 3B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 3B is divided into regions 420, 430, 440 and 450, which are referred to as fingers or sub-blocks. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 3B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 3B also shows the vertical columns being staggered. In other embodiments, different patterns of staggering can be used. In some embodiments, the vertical columns are not staggered.

Figure 3C:
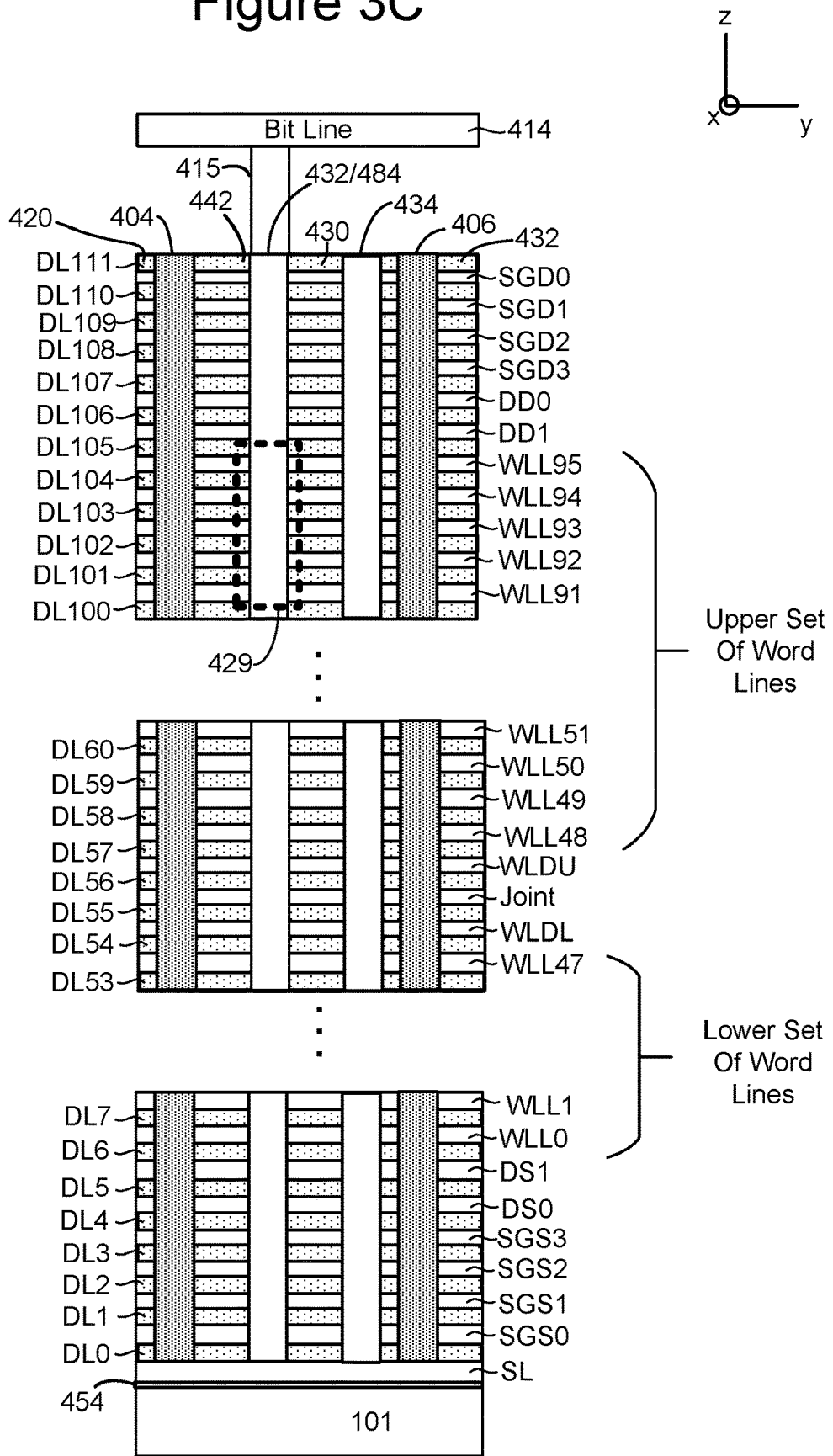
FIG. 3C depicts a cross sectional view of a portion of a block of memory cells.

FIG. 3C depicts a portion of one embodiment of a three dimensional memory structure 326 showing a cross-sectional view along line AA of FIG. 3B. This cross sectional view cuts through vertical columns 432 and 434 and region 430 (see FIG. 3B). The structure of FIG. 3C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 3B, FIG. 3C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 3C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 3C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 3C.

Figure 3D:
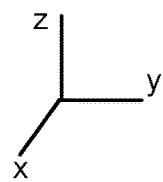
FIG. 3D depicts a view of the select gate layers and word line layers.
Figure 3D:
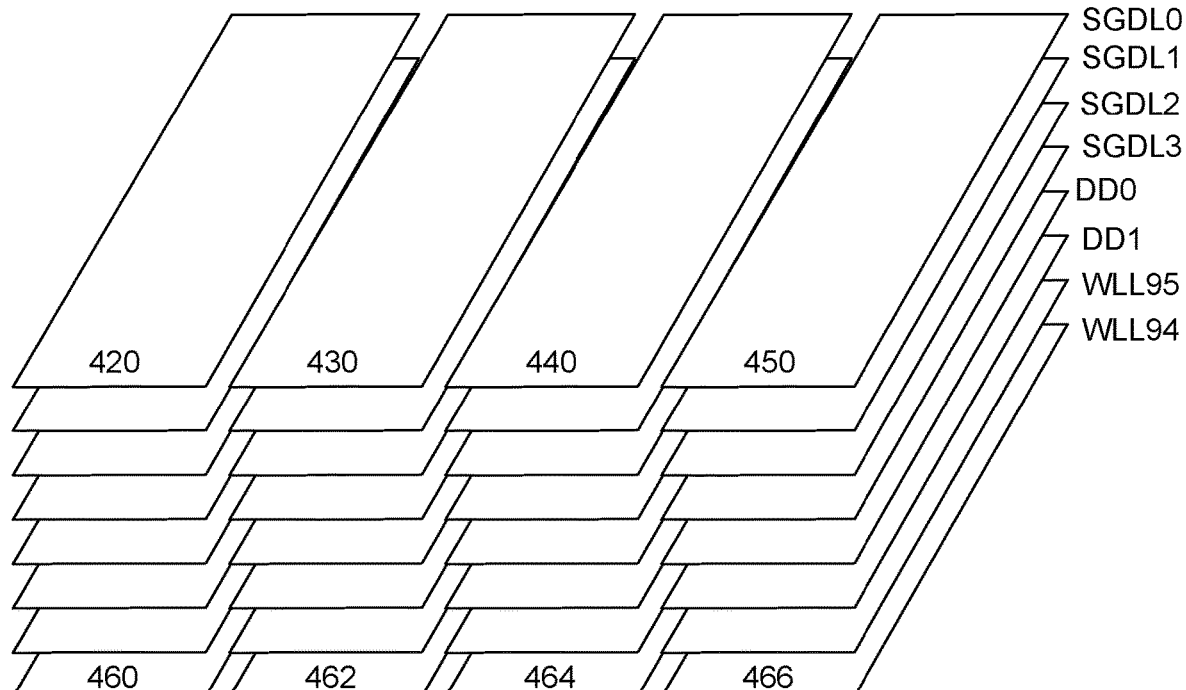
Figure 3D:
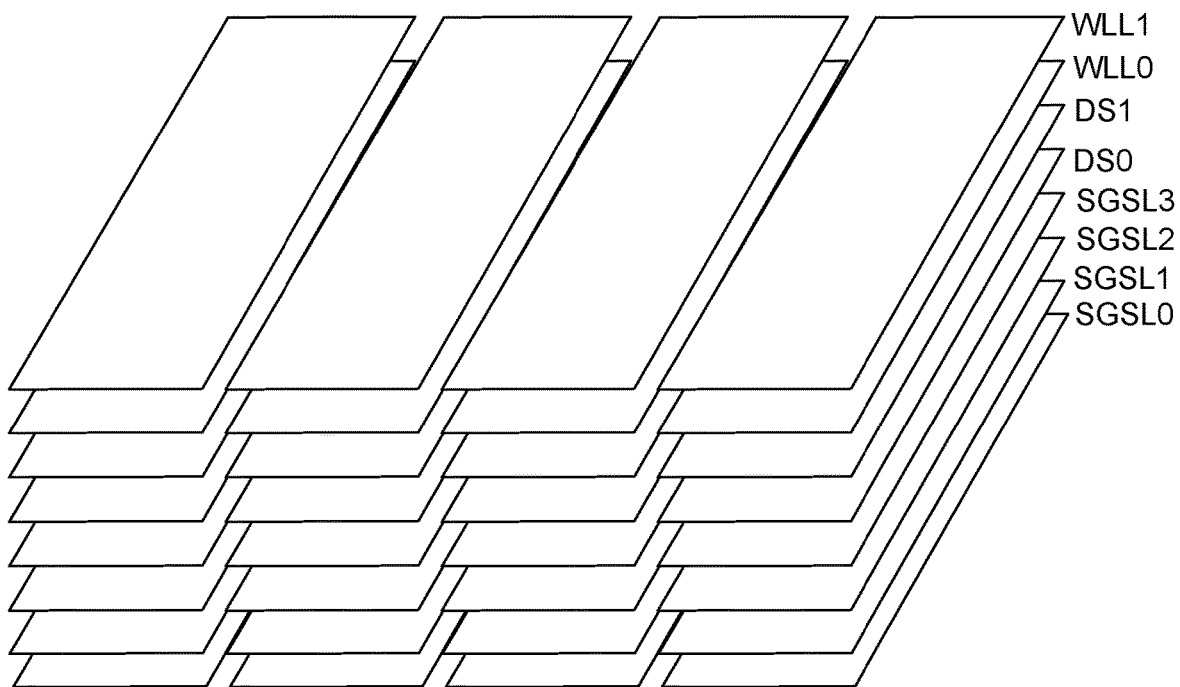

FIG. 3D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 3C. As mentioned above with respect to FIG. 3B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 3E depicts a cross sectional view of region 429 of FIG. 3C that includes a portion of vertical column 432 (a memory hole) that extends through the alternating conductive layers and dielectric layers. In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 3E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 3F:
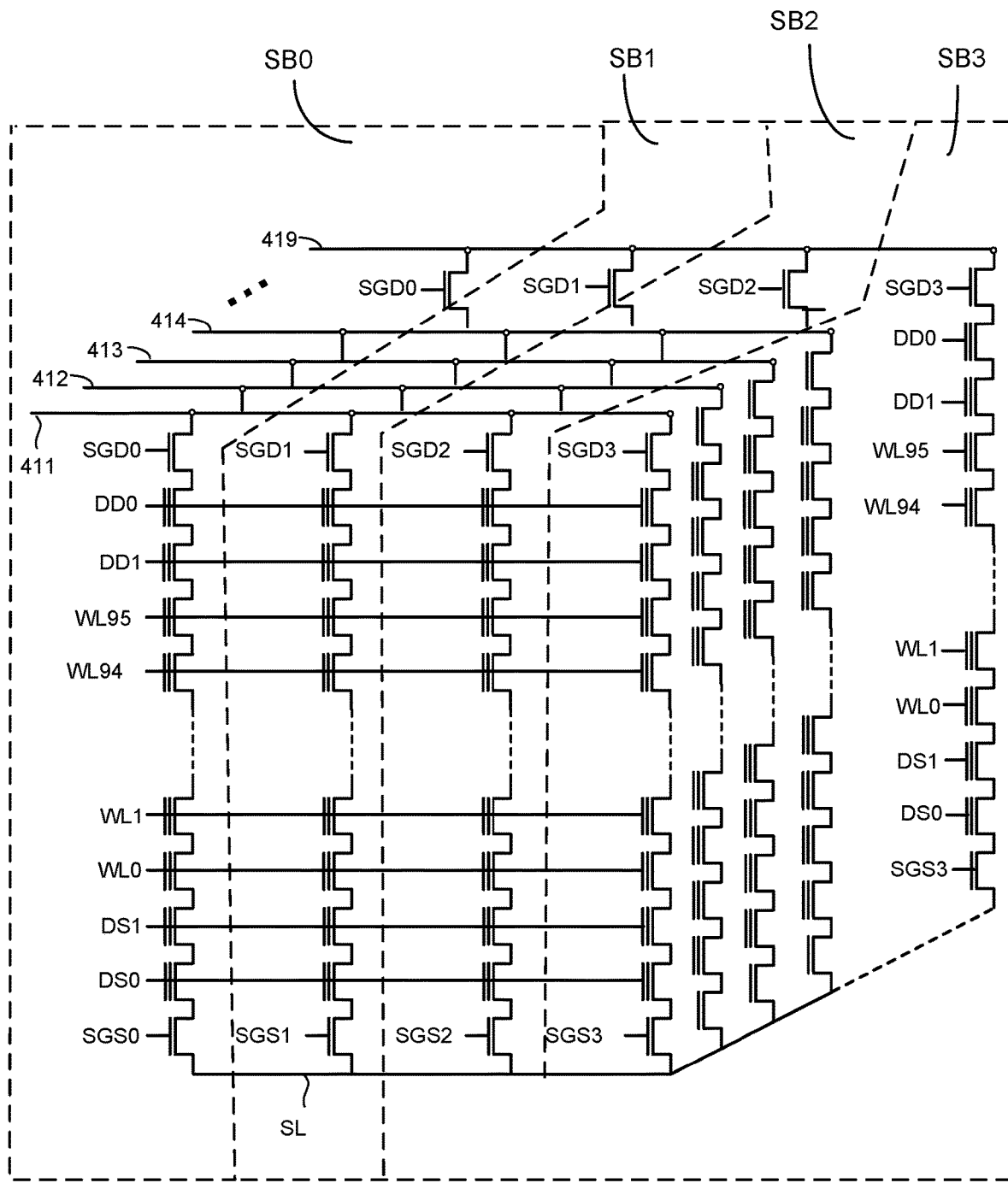
FIG. 3F is a schematic of a plurality of NAND strings showing multiple sub-blocks.

FIG. 3F is a schematic diagram of a portion of the memory depicted in in FIGS. 2-3E. FIG. 3F shows physical word lines WLL0-WLL95 running across the entire block. The structure of FIG. 3F corresponds to portion 306 in Block 2 of FIGS. 3A-E, including bit lines 411, 412, 413, 414, . . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 4:
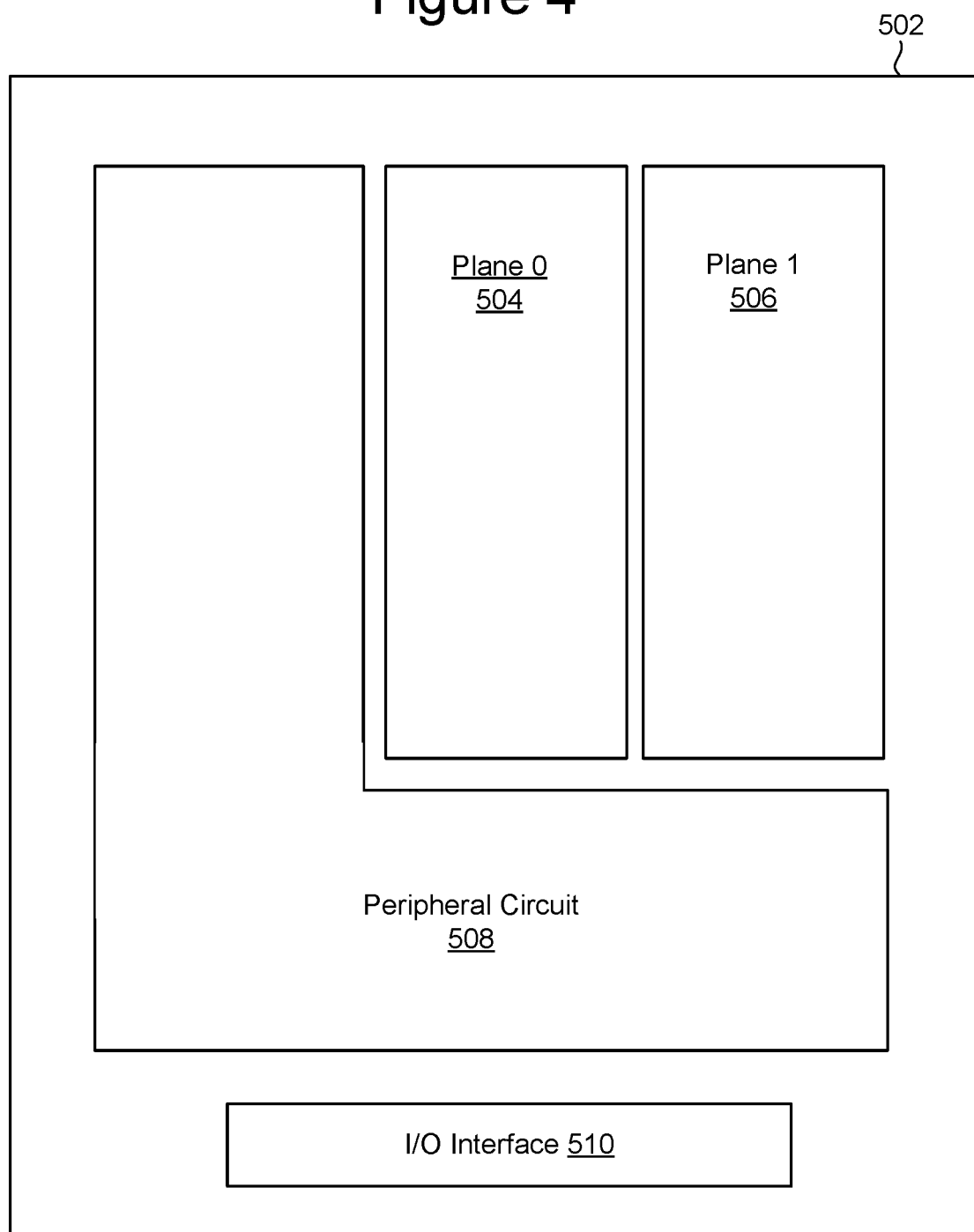
FIG. 4 is a block diagram of a memory die.

As described above, it is proposed to convert unused portions of the memory die to usable capacitors for the power I/O pad. FIG. 4 is a block diagram of a memory die 502 that has converted unused portions of the memory die to usable capacitors for the power I/O pad. Memory die 502 may be the same structure as memory die 300 of FIG. 1. Memory die 502 includes a three dimensional memory structure that includes two planes: Plane 0 (504) and Plane 1 (506). Plane 0 (504) may be the same structure as plane 302 of FIG. 3A. Plane 1 (506) may be the same structure as plane 304 of FIG. 3A. In other embodiments, more or less than two planes can be used. Plane 0 (504) and Plane 1 (506) may implement memory structure 326, including any of the embodiments mentioned above.

Memory die 502 also includes peripheral circuit 508, which can be located to the side of the memory structure (Plane 0 and Plane 1) and/or underneath the memory structure (Plane 0 and Plane 1). Peripheral circuit 508 is an electrical circuit that can include control circuitry 310, read/write circuits 328 and/or decoders 324/332. Peripheral circuit 508 can include any other circuit on the memory die that is used to control/operate the memory die.

Memory die 502 also includes I/O Interface 510, which may be the same as I/O Interface 321 of FIG. 1. For example, I/O Interface 510 may implement a Toggle Mode interface, as discussed above with respect to Table 1. I/O Interface 510 comprises a plurality of I/O connections/signals. In one embodiment, each I/O connection/signal includes an I/O pad. For example, I/O Interface 510 includes a power I/O pad/connection (e.g., VCCQ), a ground I/O pad (e.g., VSS) and data/control I/O pads (e.g. ALE, Cen, CLE, RE, Ren, Wen, WPn, DQS, DQSn, Bus, R/Bn). I/O Interface 510 is connected to and in communication with peripheral circuit 508, Plane 0 504 and Plane 1 506.

As mentioned above, it is proposed to convert unused portions of the memory die to one or more usable capacitors for the power I/O pad (or other I/O pad or other type of I/O interface). In one embodiment, portions of the memory die underneath the signal lines are configured to operate as one or more capacitors.

Figure 5:
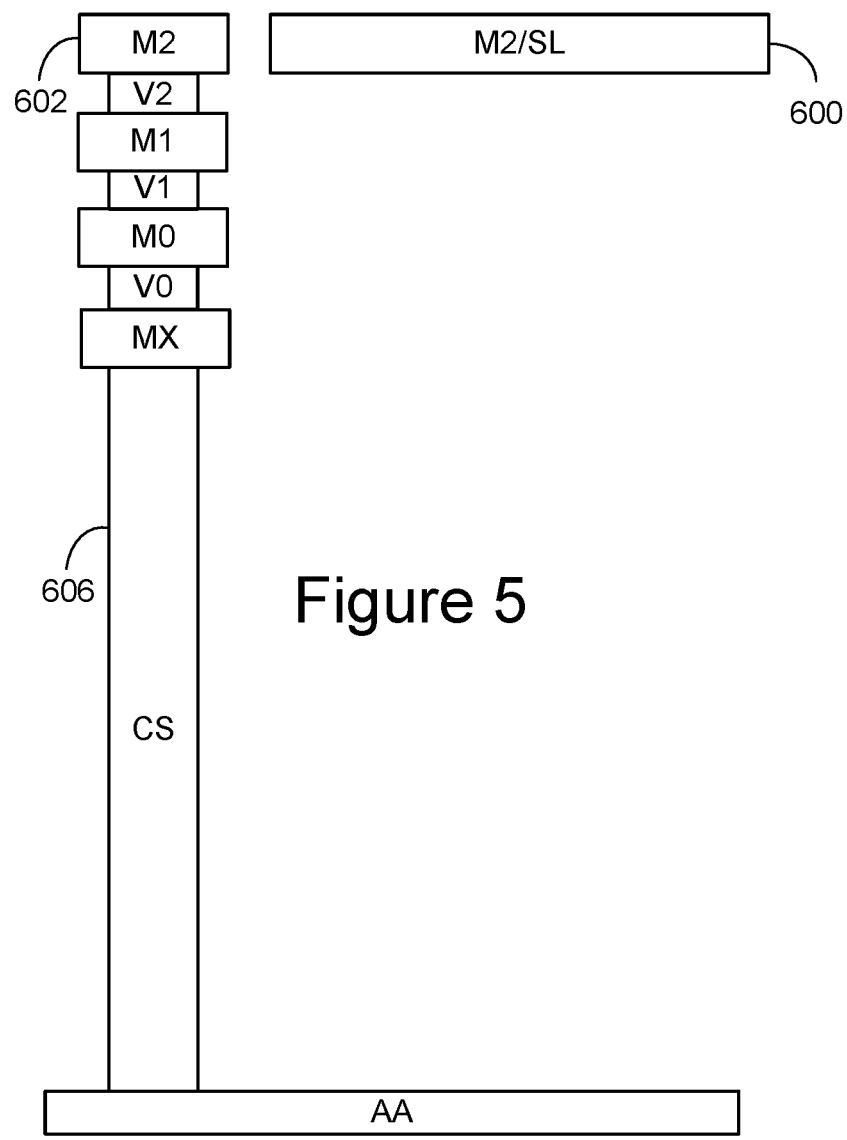
FIG. 5 is a cross sectional view of a signal line, layers of metal interconnect and a substrate.

FIG. 5 depicts various layers of one embodiment of a memory die 300/502. FIG. 5 shows an active area AA which corresponds to the semiconductor substrate. Electrical components EC (e.g., arranged in electrical circuits) can be implemented on the top surface of active area. In one embodiment, the memory die includes at least four metal interconnect layers above the substrate (AA) and above the electrical components EC. These four metal interconnect layers are labeled in FIG. 5 as MX, M0, M1, and M2. Connecting metal layers MX and M0 is via V0. Connecting metal interconnect layers M1 and M0 is via V1. Connecting metal interconnect layers M1 and M2 is via V2. Metal interconnect layer MX is connected to active area AA (substrate) by connecting hole CS 606 (e.g. which is similar to a via). Each of the metal interconnect layers can initially be added to the device as a sheet and then patterned using standard processes known in the art. FIG. 5A shows a signal line 602 in metal interconnect layer M2 that is receiving a signal from an electrical component EC on active area AA by way of the electrical path CS/MX/V0/M0/V1/M1/V2 and routing that signal to another location on metal interconnect layer M2.

FIG. 5 also shows signal line 600 in metal interconnect layer M2 next to signal line 602. In this embodiment, there are no components implemented underneath signal 600. Thus, the space below signal 600 and above the active area AA of the substrate is unused and available to house one or more capacitors.

Figure 6B:
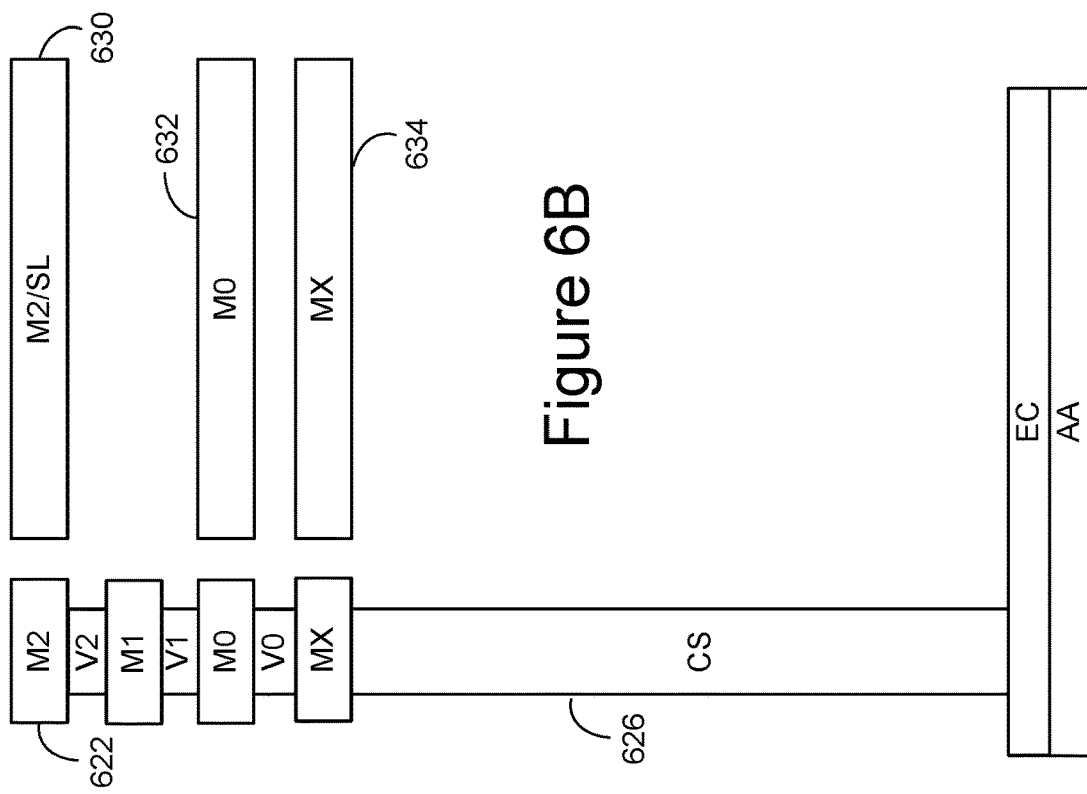
FIG. 6B is a cross sectional view of a portion of a memory die.
Figure 6A:
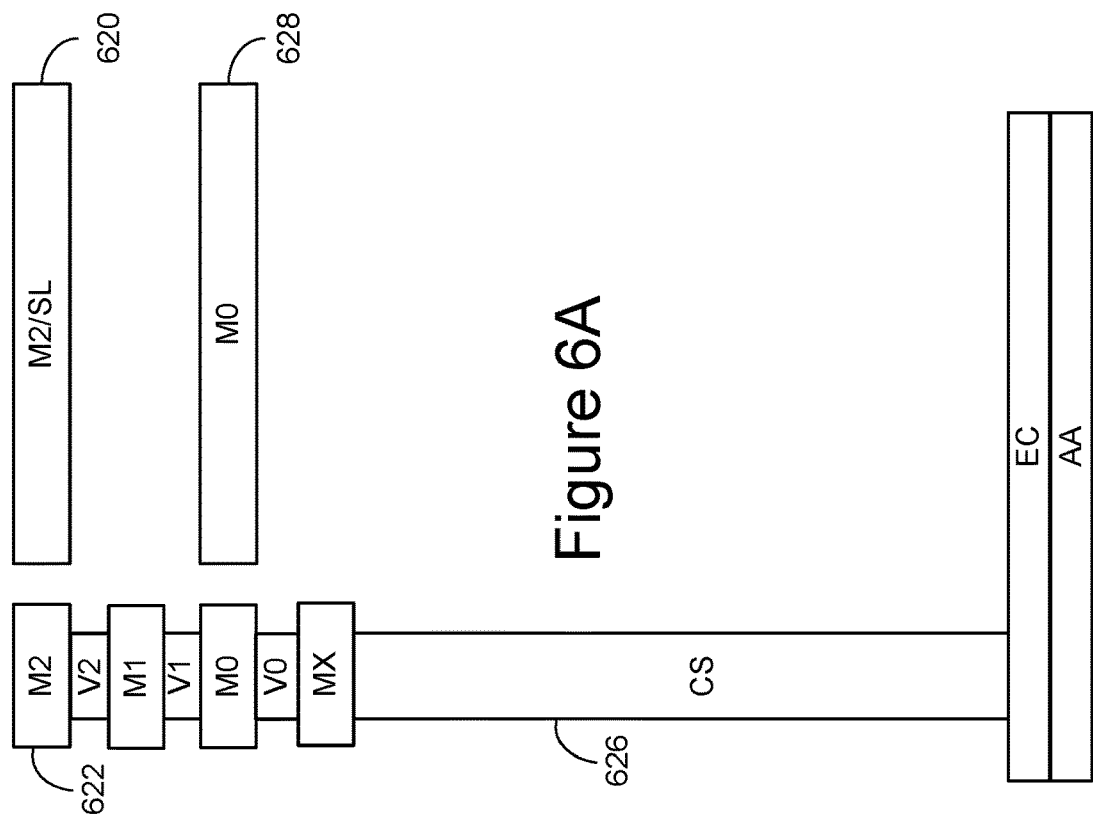
FIG. 6A is a cross sectional view of a portion of a memory die.

FIGS. 6A-C are cross sectional views that depict various layers of memory die 300/502 representing three embodiments of memory die 300/502 in which portions of the memory die underneath the signal lines are configured to operate as one or more capacitors. Like FIG. 5, FIG. 6A shows signal line 622 on metal interconnect layer M2 connected to metal interconnect layer M1 by via V2. Metal interconnect layer M1 is connected to metal interconnect layer M0 by via V1. Metal interconnect layer M0 is connected to metal interconnect layer MX by via V0. Metal interconnect layer MX is connected to active area AA by connecting hole CS 626. In some embodiments, metal interconnect layers MX, M0, M1 and M2 (in general) are connected to peripheral circuit 508, and the memory structure (e.g., Plane 0 504 and Plane 1 506).

FIG. 6A also shows electrical components EC implemented on the top surface of active area AA (substrate). The electrical components EC can be an electrical circuit, transistors, capacitors, etc. The capacitors that are part of the electrical components EC can be standard capacitors known in the art, formed from transistors or can be ONO capacitors. Signal line 622 in metal interconnect layer M2 is receiving a signal from (or providing a signal to) electrical components EC on active area AA by way of the electrical path CS/MX/V0/M0/V1/M1/V2 and routing that signal to/from another location on metal interconnect layer M2.

FIG. 6A also shows signal line 620 implemented in metal interconnect layer M2. Signal line 620 can be any type of metal signal line including a single data signal, a data bus, a control signal, a power signal, a ground signal, a clock signal, or other type of signal. Signal line 620 connects to various portions of the peripheral circuit 508 and the memory structure (e.g., Plane 0 504 and Plane 1 506). Positioned directly below signal line 620 is one or more metal components 628 in metal interconnect layer M0 that form one or more capacitors. In one example embodiment, the capacitor includes two metal components in a single metal interconnect layer. FIG. 6A shows the one or more capacitors implemented in metal interconnect layer M0; however, the one or more capacitors can also implemented in other metal interconnect layers, such as MX or M1. In one example implementation, the capacitor is not implemented in metal interconnect layer M1 so that there is separation between the capacitor and signal line 620. More details of one or more metal components 628 are provided below.

In one embodiment, the capacitor in metal interconnect layer M0 (of a different layer) is positioned directly below the signal line 620. In other embodiments, the capacitor in metal interconnect layer M0 (of a different layer) is positioned directly below an area adjacent to signal line 620. In another embodiment, the capacitor in metal interconnect layer M0 (of a different layer) is positioned in any unused portion of the memory die outside of the memory array.

In one embodiment, memory structure 326 (e.g., Plane 0 504 and Plane 1 506) is positioned below metal interconnect layers M2, M1, M0 and MX; and above electrical components EC and active area AA (substrate).

FIG. 6B depicts another embodiment for implementing one or more capacitors in unused areas underneath signal lines. The embodiment of FIG. 6B implements one or more capacitors in two metal interconnect layers. FIG. 6B shows signal line 622 in metal interconnect layer M2 is receiving a signal from (or providing a signal to) electrical components EC on active area AA by way of the electrical path CS/MX/V0/M0/V1/M1/V2 and routing that signal to/from another location on metal interconnect layer M2. FIG. 6B also shows signal line 630 implemented in metal interconnect layer M2. Positioned directly below signal line 630 is one or more metal components 632 in metal interconnect layer M0 and one or more metal components 634 in metal interconnect layer MX that form one or more capacitors. FIG. 6B shows the one or more capacitors implemented in metal interconnect layers M0 and MX; however, the capacitors can implemented in any two adjacent (or nearby) metal interconnect layers. In one example, one or more metal components 632 form one or more capacitors in metal interconnect layer M0 and one or more metal components 634 form one or more capacitors in metal interconnect layer MX. In another example, one or more metal components 632 and one or more metal components 634 form a capacitor that includes a first metal component in a first metal interconnect layer (e.g., M0) directly below signal line 630 and a second metal component in a second metal interconnect layer (e.g., MX) directly below signal line 630. More details of one or more metal components 632 and one or more metal components 634 are provided below.

FIG. 6C depicts another embodiment for implementing one or more capacitors in unused areas underneath signal lines. The embodiment of FIG. 6C implements one or more capacitors in three metal interconnect layers. FIG. 6C also shows signal line 622 in metal interconnect layer M2 is receiving a signal from (or providing a signal to) electrical components EC on active area AA by way of the electrical path CS/MX/V0/M0/V1/M1/V2 and routing that signal to/from another location on metal interconnect layer M2. FIG. 6C also shows signal line 640 implemented in metal interconnect layer M2. Positioned directly below signal line 640 is one or more metal components 642 in metal interconnect layer M1, one or more metal components 644 in metal interconnect layer M0, and one or more metal components 646 in metal interconnect layer MX that form one or more capacitors. Although one or more metal components 642/644/646 are depicted as being directly below signal line 640, one or more metal components 642/644/646 can also be offset from signal line 640 and/or longer and/or wider than signal line 640. In one example, one or more metal components 642 form one or more capacitors in metal interconnect layer M1, one or more metal components 644 form one or more capacitors in metal interconnect layer M0 and one or more metal components 646 form one or more capacitors in metal interconnect layer MX. In another example, one or more metal components 642/644/646 includes a first metal component in a first metal interconnect layer and a second metal component in a second metal interconnect layer below signal line 640. More details of one or more metal components 642, one or more metal components 644 and one or more metal components 646 are provided below.

FIGS. 5, 6A, 6B and 6C describe a set of embodiments that include an electrical circuit (e.g., peripheral circuit 508), a plurality of metal interconnect layers connected to the electrical circuit (e.g., M1, M0 and MX), a signal line connected to the electrical circuit (e.g., signal lines 620, 630, 640), a plurality of I/O connections (e.g., the I/O pads of I/O Interface 510) in communication with the electrical circuit, and one or more capacitors connected to a power I/O connection (e.g., power I/O pad) of the plurality of I/O connections, where the one or more capacitors are positioned in one or more of the metal interconnect layers and below the signal line.

In addition to the one or more capacitors of MX/M0/M1 being below a signal line, the one or more capacitors of MX/M0/M1 are positioned directly above one or more electrical components EC on the surface of the substrate (AA). For example, the one or more capacitors of MX/M0/M1 are positioned directly above one or more device capacitors (which are examples of electrical components EC on the surface of the substrate). A device capacitor refers to a capacitor implemented on the surface of the substrate. The device capacitor can be a standard capacitor known in the art, a capacitor formed from one or more transistors or can be an ONO capacitor. In one embodiment, the electrical components EC on the surface of the substrate AA include a metal plate that forms a capacitor with one or more components of metal layer MX.

Figure 7A:
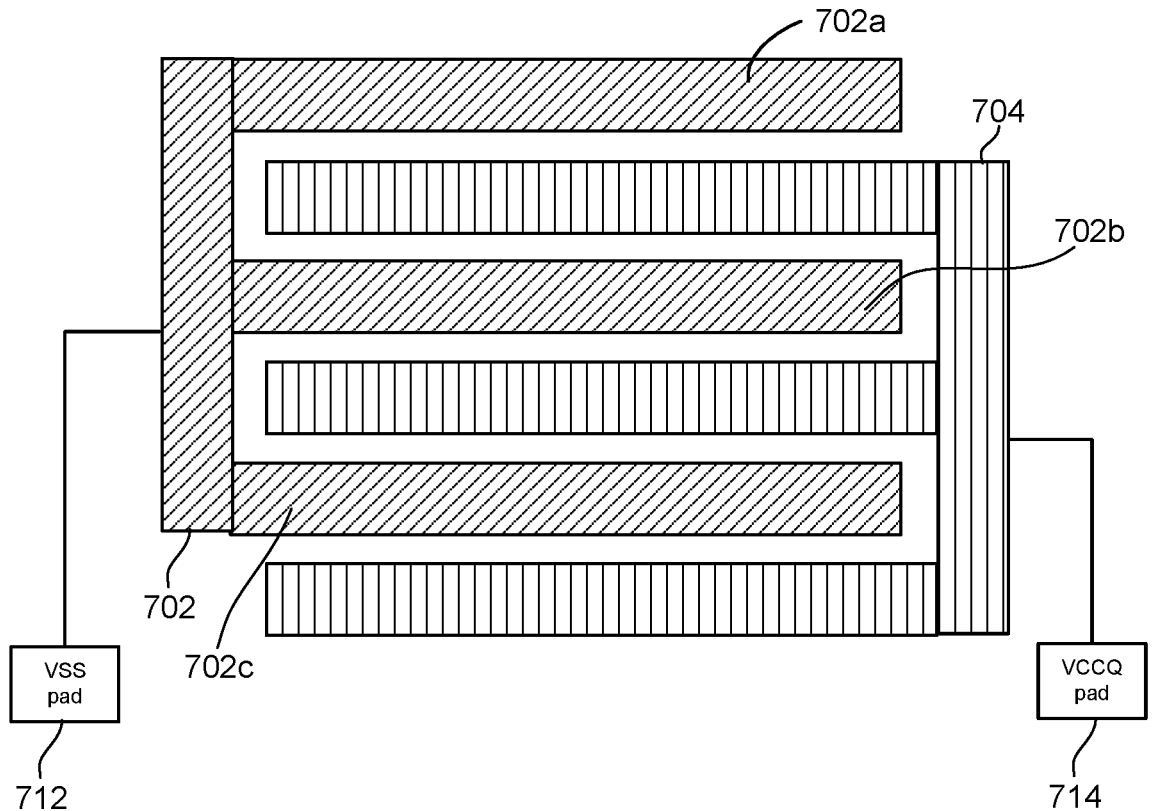
FIG. 7A is a top view of a metal layer patterned into two metal components that form a capacitor.

FIG. 7A is a top view of a metal interconnect layer patterned into two metal components that form a capacitor. The structure of FIG. 7A can be used to implement any of the metals interconnect layers (e.g., M1, M0 and MX) below a signal line or above a device capacitor. For example, the structure of FIG. 7A can be used to implement the one or more components 628 in metal interconnect layer M0 of FIG. 6A, the one or more components 632 in metal interconnect layer M0 of FIG. 6B, the one or more components 634 in metal interconnect layer MX of FIG. 6B, the one or more components 642 in metal interconnect layer M1 of FIG. 6C, the one or more components 644 in metal interconnect layer M0 of FIG. 6C, and the one or more components 646 in metal interconnect layer MX of FIG. 6C.

In one embodiment, the metal interconnect layer is patterned into a set of interleaved combs having interdigitated fingers. For example, FIG. 7A shows a two interleaved metal combs 702 and 704. Comb 702 includes finger 702a, finger 702b and finger 702c. Comb 704 includes finger 704a, finger 704b and finger 704c. Fingers 702a, 702b, 702c are interleaved with fingers 704a, 704b, 704c to create interdigitated fingers. In one embodiment, combs 702 and 704 are metal (and can be referred to as metal members or metal components). Comb 702 (with its interdigitated fingers 702a, 702v, 702c) is connected to VSS pad 712 (ground). Comb 704 (with its interdigitated fingers 704a, 704b, 704c) is connected to VCCQ pad 714 (power). Comb 702 and comb 704 form a capacitor that includes two metal components (combs 702 and 704) in a single metal interconnect layer that are shaped as interleaved combs and have interdigitated fingers.

Figure 7B:
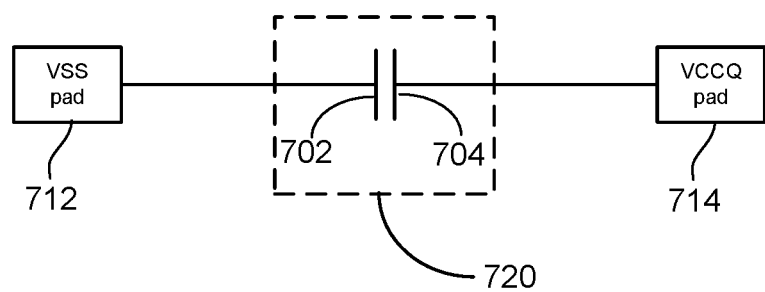
FIG. 7B is a symbolic schematic diagram of the capacitor depicted in FIG. 7A.

FIG. 7B is a symbolic schematic diagram of the capacitor depicted in FIG. 7A. FIG. 7B shows capacitor 720, comprising comb 702 and comb 704, connecting to VSS pad 712 and VCCQ pad 714. VSS pad 712 and VCCQ pad 714 are part of one embodiment of I/O interface 510.

Figure 8A:
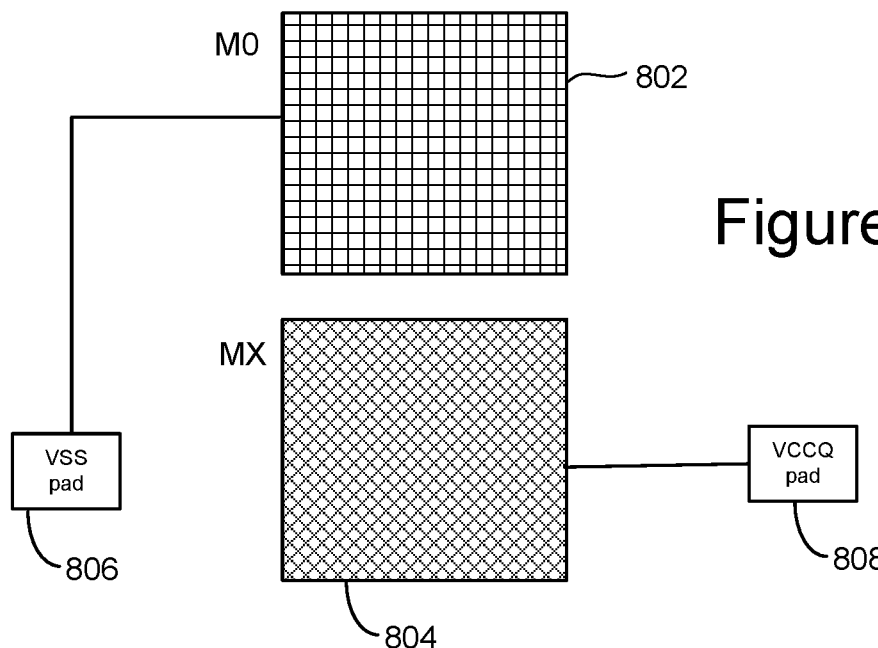
FIG. 8A is a top view of two metals layers, each of which includes a metal plate.
Figure 8B:
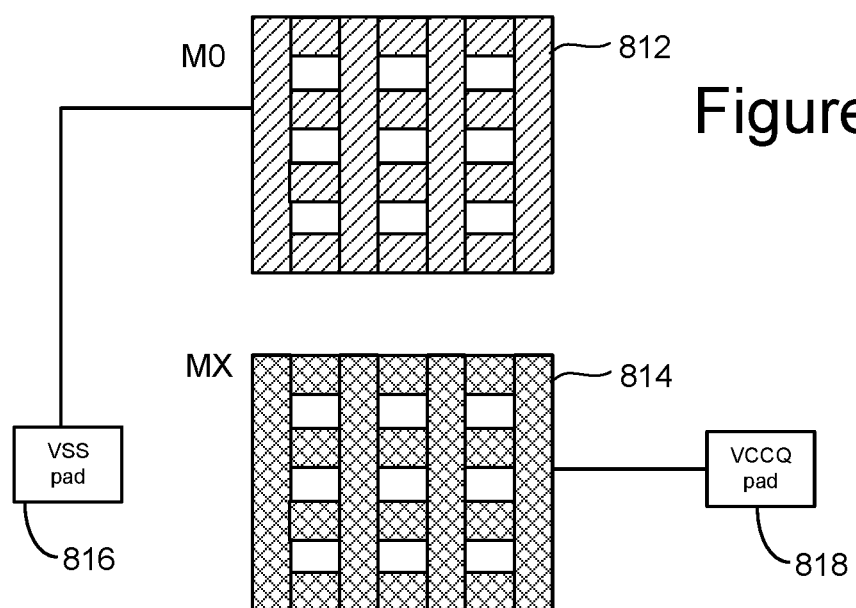
FIG. 8B is a top view of two metal layers, each of which has been patterned into a mesh shaped metal component.
Figure 8C:
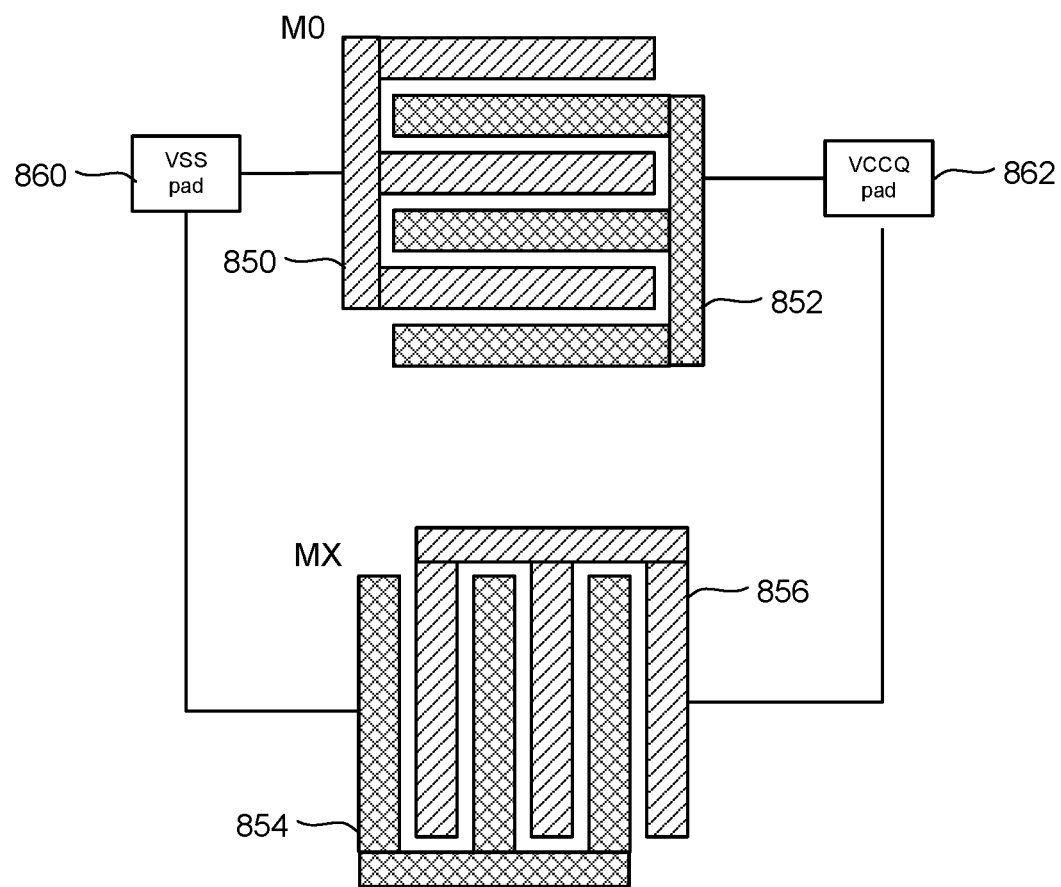
FIG. 8C is a top view of two metal layers, each of which has been patterned into a pair of interleaved combs.

FIGS. 8A-C provides more details of examples of the one or more components implementing the metal interconnect layers for the embodiment of FIG. 6B. That is, FIGS. 8A-C show examples of the one or more components 632 of metal interconnect layer M0 and the one or more components 634 of metal interconnect layer MX.

FIG. 8A is a top view of two metal interconnect layers M0 and MX pertaining to an embodiment where a capacitor includes a first metal component in a first metal interconnect layer below a signal lines and a second metal component in a second metal interconnect layer below the signal line. Although FIG. 8A shows the two metal interconnect layers being MX and M0, other metal interconnect layers can also be implemented. The embodiment of FIG. 8A includes a metal plate 802 in metal interconnect layer M0 and a metal plate 804 in interconnect layer MX. Metal plate 802 is connected to VSS pad 806. Metal plate 804 is connected to VCCQ pad 808. VSS pad 806 and VCCQ pad 808 are part of one embodiment of I/O interface 510. Metal plate 802 and metal plate 804 form a capacitor that is connected to VCCQ.

FIG. 8B is a top view of two metal interconnect layers M0 and MX pertaining to an embodiment where a capacitor includes a first metal component in a first metal interconnect layer below a signal line and a second metal component in a second metal interconnect layer below the signal. Although FIG. 8B shows the two metal interconnect layers being MX and M0, other metal interconnect layers can also be implemented. The embodiment of FIG. 8B includes a metal mesh 812 in metal interconnect layer M0 and a metal mesh 814 in interconnect layer MX. Metal mesh 812 is connected to VSS pad 816. Metal mesh 814 is connected to VCCQ pad 818. VSS pad 816 and VCCQ pad 818 are part of one embodiment of I/O interface 510. Metal mesh 812 and metal mesh 814 form a capacitor that is connected to VCCQ.

FIG. 8C is a top view of two metal interconnect layers M0 and MX pertaining to an embodiment where a capacitor includes a first metal component in a first metal interconnect layer below a signal line (and/or above a device capacitor) and a second metal component in a second metal interconnect layer below the signal line (and/or above a device capacitor). The embodiment of FIG. 8C also includes capacitors having two metal components in a single metal interconnect layer. Metal interconnect layer M0 includes two metal interleaved combs 850 and 852 having interdigitated fingers. Metal comb 850 is connected to VSS pad 860. Metal comb 852 is connected to VCCQ pad 862. VSS pad 860 and VCCQ pad 862 are part of one embodiment of I/O interface 510. Metal interconnect layer MX includes two metal interleaved combs 854 and 856 having interdigitated fingers. Metal comb 854 is connected to VSS pad 860. Metal comb 856 is connected to VCCQ pad 862. There are four capacitors formed by the structure of FIG. 8C: (1) a first capacitor comprising metal comb 850 and metal comb 852, (2) a second capacitor comprising metal comb 854 and metal comb 856, (3) a third capacitor comprising metal comb 850 and metal comb 856, and (4) a fourth capacitor comprising metal comb 852 and metal comb 854. Although FIG. 8B shows the two metal interconnect layers being MX and M0, other metal interconnect layers can also be implemented. Metal combs 850, 852, 854 and 856 are the same structure as metal combs 702 and 704 of FIG. 7A. The first capacitor (850/852) and the second capacitor (854/856) each include two metal components in a single metal interconnect layer. The third capacitor (850/856) and the fourth capacitor (852/854) each include a first metal component in a first metal interconnect layer below a signal line and a second metal component in a second metal interconnect layer below the signal line.

FIGS. 9A-H provides more details of examples of the one or more components implementing the metal interconnect layers for the embodiment of FIG. 6C. That is, FIGS. 9A-H show examples of the one or more components 642 of metal interconnect layer M1, one or more components 644 of metal interconnect layer M0, and the one or more components 646 of metal interconnect layer MX.

Figure 9A:
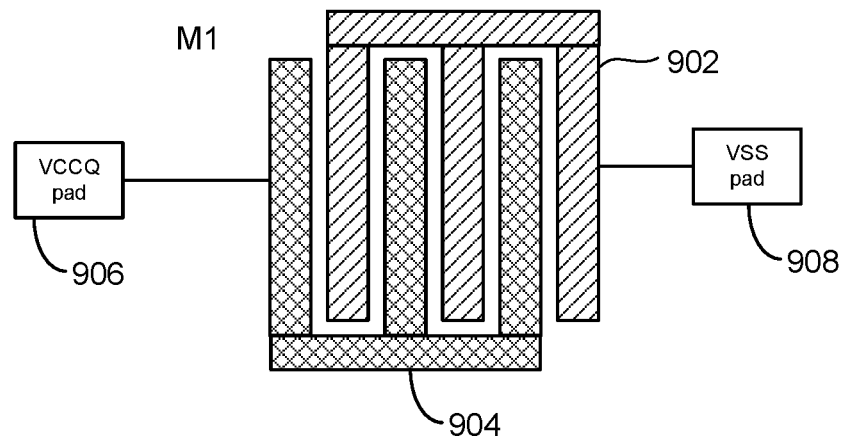
FIG. 9A is a top view of three metal layers, each of which has been patterned into a pair of interleaved combs.
Figure 9A:
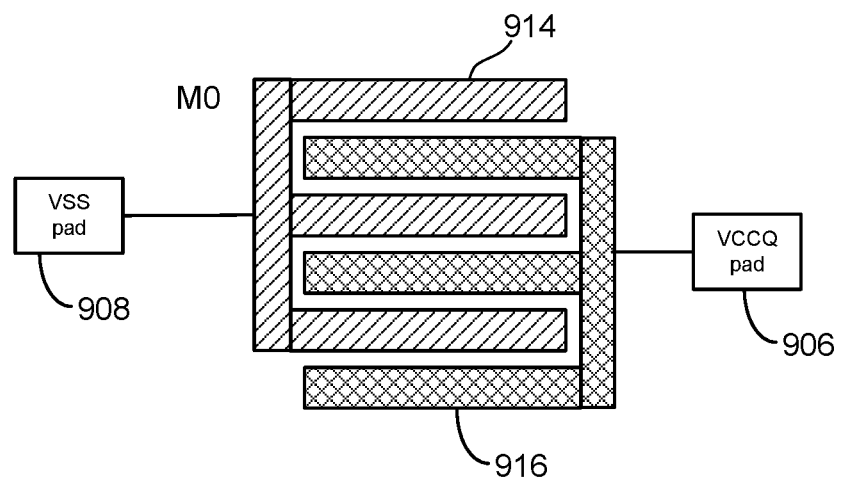
Figure 9A:
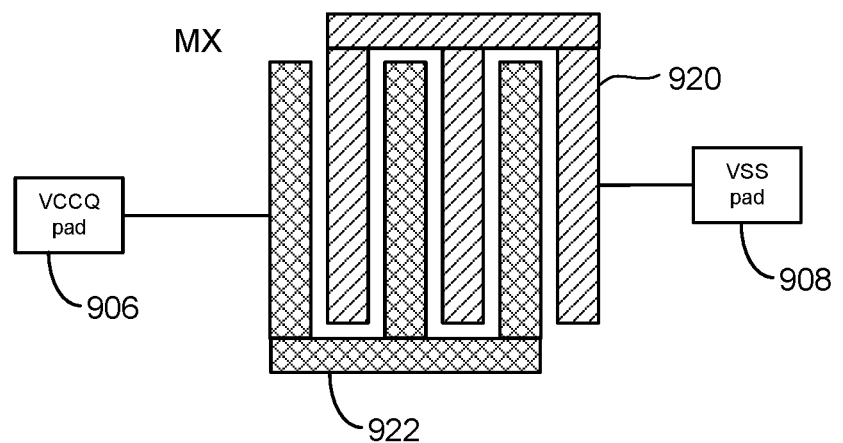

FIG. 9A is a top view of three metal interconnect layers M1, M0 and MX for an embodiment where capacitors include a first metal component in a first metal interconnect layer below a signal line and a second metal component in a second metal interconnect layer below the signal line (and above a device capacitor). The embodiment of FIG. 9A also includes capacitors having two metal components in a single metal interconnect layer.

Metal interconnect layer M1 includes two metal interleaved combs 902 and 904 having interdigitated fingers. Metal comb 902 is connected to VSS pad 908. Metal comb 904 is connected to VCCQ pad 906. VSS pad 906 and VCCQ pad 908 are part of one embodiment of I/O interface 510. Metal interconnect layer M0 includes two metal interleaved combs 914 and 916 having interdigitated fingers. Metal comb 914 is connected to VSS pad 908. Metal comb 916 is connected to VCCQ pad 906. Metal interconnect layer MX includes two metal interleaved combs 920 and 922 having interdigitated fingers. Metal comb 920 is connected to VSS pad 908. Metal comb 922 is connected to VCCQ pad 906. Metal combs 902, 904, 914, 916, 920 and 922 are the same structure as metal combs 702 and 704 of FIG. 7A. Metal combs 902 and 920 are in a first orientation, while metal combs 904 and 922 are in a second orientation that is opposite in direction than the first orientation. Metal comb 914 is in a third orientation that is −90 degrees rotated from the first orientation. Metal comb 916 is in a fourth orientation that is +90 degrees rotated from the first orientation.

There are seven capacitors formed by the structure of FIG. 9A: (1) a first capacitor comprising metal comb 902 and metal comb 904, (2) a second capacitor comprising metal comb 914 and metal comb 916, (3) a third capacitor comprising metal comb 920 and metal comb 922, (4) a fourth capacitor comprising metal comb 902 and metal comb 916, (5) a fifth capacitor comprising metal comb 904 and metal comb 914, (6) a sixth capacitor comprising metal comb 914 and metal comb 922, and (7) a seventh capacitor comprising metal comb 916 and metal comb 920.

Figure 9B:
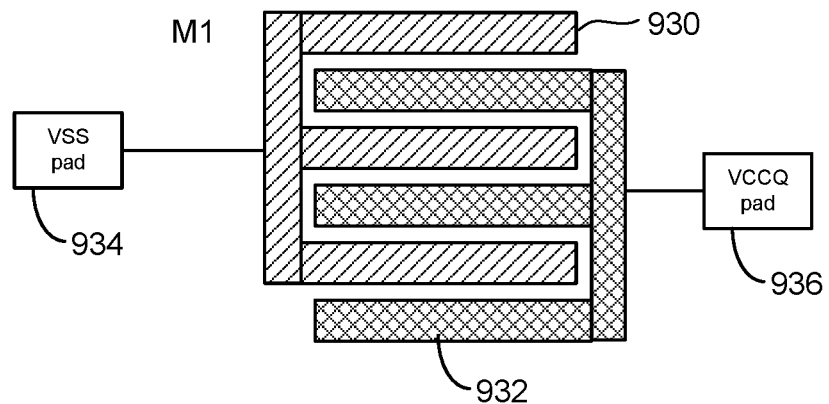
FIG. 9B is a top view of three metal layers, each of which has been patterned into a pair of interleaved combs.
Figure 9B:
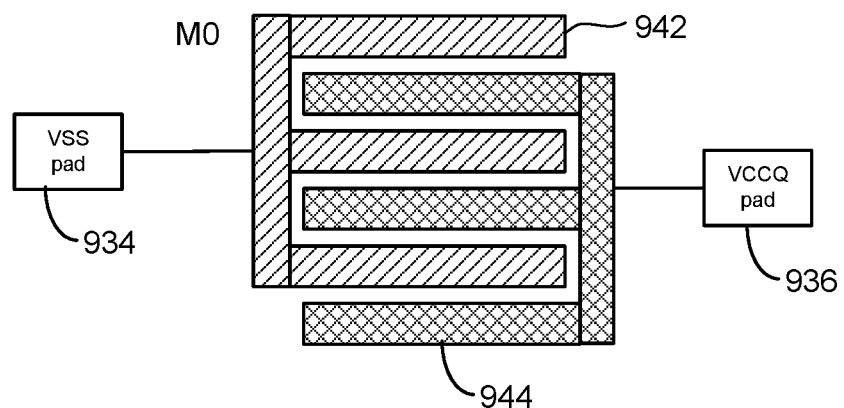
Figure 9B:
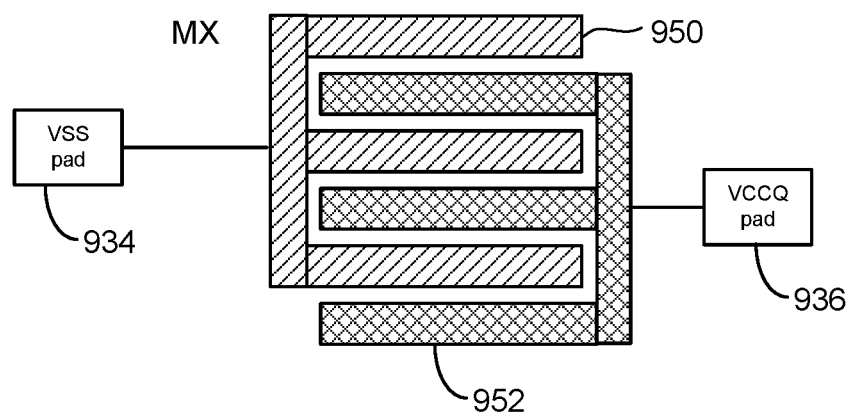

FIG. 9B is a top view of three metal interconnect layers M1, M0 and MX for another embodiment where capacitors include a first metal component in a first metal interconnect layer below a signal lines and a second metal component in a second metal interconnect layer below the signal line (and above a device capacitor). The embodiment of FIG. 9B also includes capacitors having two metal components in a single metal interconnect layer. The structure of FIG. 9B has different connections to VSS and VCCQ and different orientations of the combs, as compared to FIG. 9A.

Metal interconnect layer M1 includes two metal interleaved combs 930 and 932 having interdigitated fingers. Metal comb 930 is connected to VSS pad 934. Metal comb 932 is connected to VCCQ pad 936. VSS pad 934 and VCCQ pad 936 are part of one embodiment of I/O interface 510. Metal interconnect layer M0 includes two metal interleaved combs 942 and 944 having interdigitated fingers. Metal comb 942 is connected to VSS pad 934. Metal comb 944 is connected to VCCQ pad 936. Metal interconnect layer MX includes two metal interleaved combs 950 and 952 having interdigitated fingers. Metal comb 950 is connected to VSS pad 934. Metal comb 952 is connected to VCCQ pad 936. Metal combs 930, 932, 942, 944, 950 and 952 are the same structure as metal combs 702 and 704 of FIG. 7A. Metal combs 930, 942, and 950 are in one orientation. Metal combs 932, 944, and 952 are an opposite orientation to metal combs 930, 942, and 950.

There are seven capacitors formed by the structure of FIG. 9A: (1) a first capacitor comprising metal comb 930 and metal comb 932, (2) a second capacitor comprising metal comb 942 and metal comb 944, (3) a third capacitor comprising metal comb 950 and metal comb 952, (4) a fourth capacitor comprising metal comb 930 and metal comb 944, (5) a fifth capacitor comprising metal comb 932 and metal comb 942, (6) a sixth capacitor comprising metal comb 942 and metal comb 952, and (7) a seventh capacitor comprising metal comb 944 and metal comb 950.

Figure 9C:
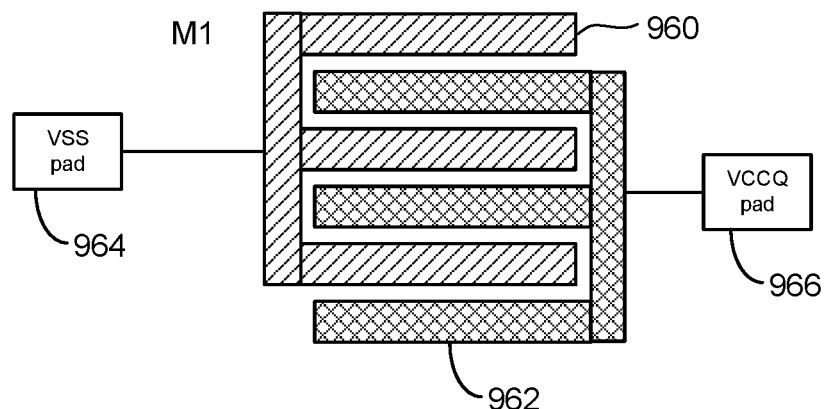
FIG. 9C is a top view of three metal layers, each of which has been patterned into a pair of interleaved combs.
Figure 9C:
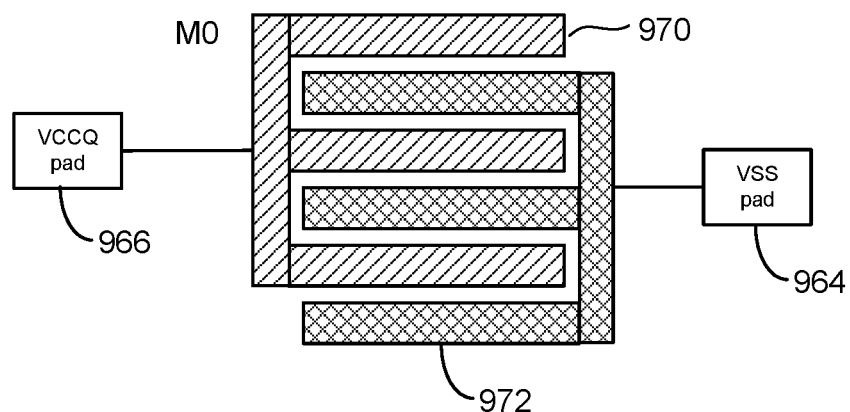
Figure 9C:
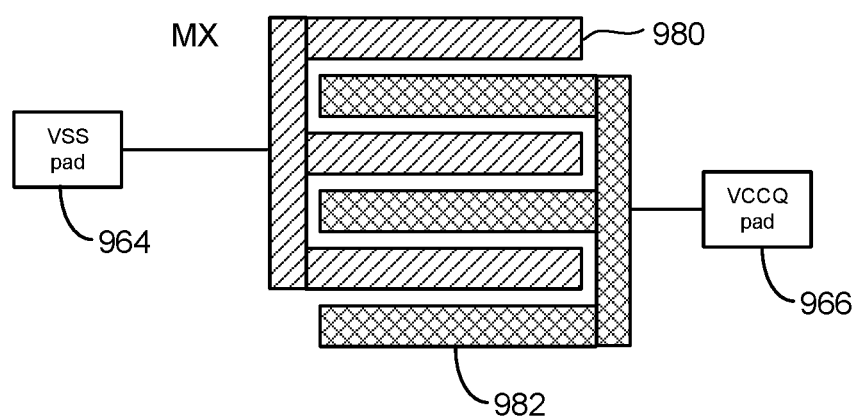

FIG. 9C is a top view of three metal interconnect layers M1, M0 and MX for another embodiment where capacitors include a first metal component in a first metal interconnect layer below a signal line and a second metal component in a second metal interconnect layer below the signal line. The embodiment of FIG. 9C also includes capacitors having two metal components in a single metal interconnect layer. The structure of FIG. 9C has different connections to VSS and VCCQ than the structure of FIG. 9B.

Metal interconnect layer M1 includes two metal interleaved combs 960 and 962 having interdigitated fingers. Metal comb 960 is connected to VSS pad 964. Metal comb 932 is connected to VCCQ pad 966. VSS pad 964 and VCCQ pad 966 are part of one embodiment of I/O interface 510. Metal interconnect layer M0 includes two metal interleaved combs 970 and 972 having interdigitated fingers. Metal comb 972 is connected to VSS pad 964. Metal comb 970 is connected to VCCQ pad 966. Metal interconnect layer MX includes two metal interleaved combs 980 and 982 having interdigitated fingers. Metal comb 980 is connected to VSS pad 964. Metal comb 982 is connected to VCCQ pad 966. Metal combs 960, 962, 970, 972, 980 and 982 are the same structure as metal combs 702 and 704 of FIG. 7A. Metal combs 960, 970, and 980 are in one orientation. Metal combs 962, 972, and 982 are an opposite orientation to metal combs 960, 970, and 980.

There are seven capacitors formed by the structure of FIG. 9A: (1) a first capacitor comprising metal comb 960 and metal comb 962, (2) a second capacitor comprising metal comb 970 and metal comb 972, (3) a third capacitor comprising metal comb 980 and metal comb 982, (4) a fourth capacitor comprising metal comb 960 and metal comb 970, (5) a fifth capacitor comprising metal comb 962 and metal comb 972, (6) a sixth capacitor comprising metal comb 970 and metal comb 980, and (7) a seventh capacitor comprising metal comb 972 and metal comb 982.

Figure 9E:
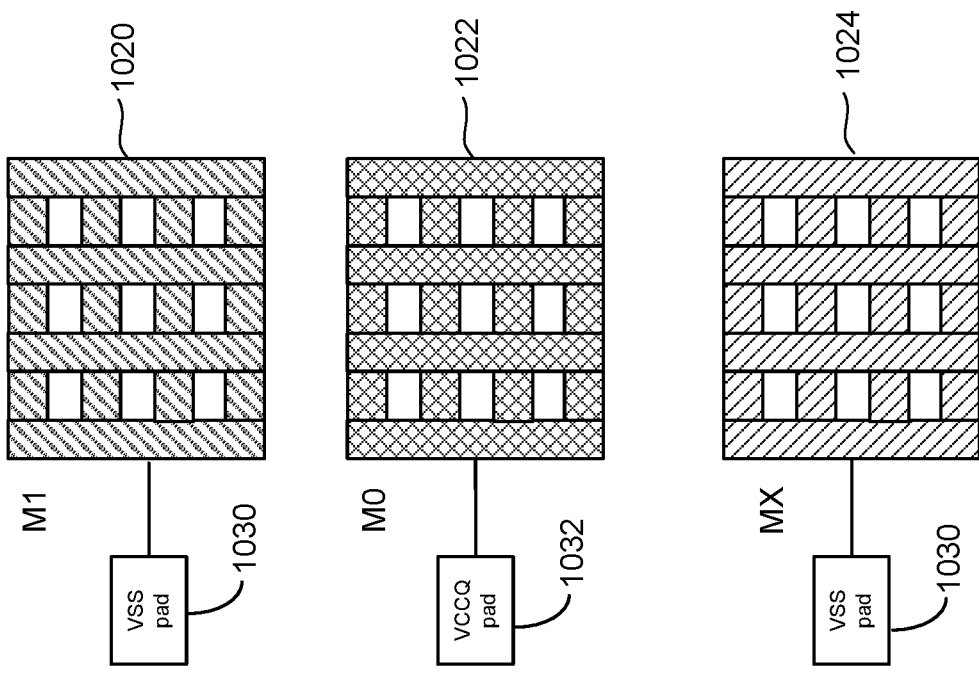
FIG. 9E is a top view of three metal layers, each of which has been patterned into a mesh shaped metal component.
Figure 9D:
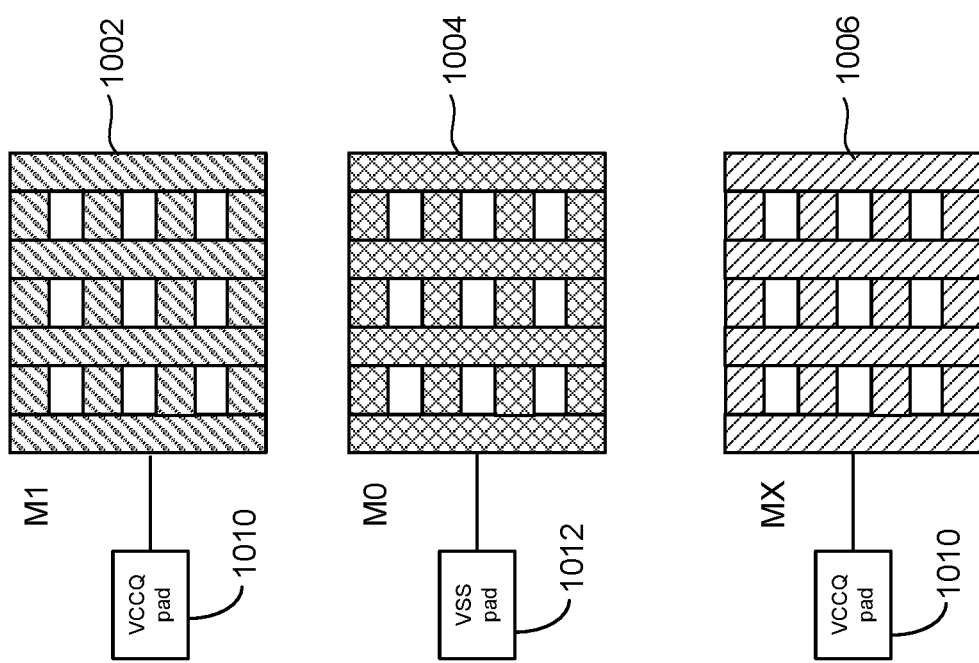
FIG. 9D is a top view of three metal layers, each of which has been patterned into a mesh shaped metal component.

FIG. 9D is a top view of three metal interconnect layers M1, M0 and MX for another embodiment where capacitors include a first metal component in a first metal interconnect layer below a signal line and a second metal component in a second metal interconnect layer below the signal line. Metal interconnect layer M1 includes metal mesh 1002 connected to VCCQ pad 1010. Metal interconnect layer M0 includes metal mesh 1004 connected to VSS pad 1012. Metal interconnect layer MX includes metal mesh 1006 connected to VCCQ pad 1010. There are two capacitors formed by the structure of FIG. 9D: (1) a first capacitor comprising metal mesh 1002 and metal mesh 1004 and (2) a second capacitor comprising metal mesh 1004 and metal mesh 1006. VSS pad 1012 and VCCQ pad 1010 are part of one embodiment of I/O interface 510.

FIG. 9E is a top view of three metal interconnect layers M1, M0 and MX for another embodiment where capacitors include a first metal component in a first metal interconnect layer below a signal line and a second metal component in a second metal interconnect layer below the signal line. Metal interconnect layer M1 includes metal mesh 1020 connected to VSS pad 1030. Metal interconnect layer M0 includes metal mesh 1022 connected to VCCQ pad 1032. Metal interconnect layer MX includes metal mesh 1024 connected to VSS pad 1030. There are two capacitors formed by the structure of FIG. 9E: (1) a first capacitor comprising metal mesh 1020 and metal mesh 1022 and (2) a second capacitor comprising metal mesh 1022 and metal mesh 1024. VSS pad 1030 and VCCQ pad 1032 are part of one embodiment of I/O interface 510.

FIG. 9F is a top view of three metal interconnect layers M1, M0 and MX for another embodiment where capacitors include a first metal component in a first metal interconnect layer below a signal line and a second metal component in a second metal interconnect layer below the signal line. Metal interconnect layer M1 includes metal plate 1050 connected to VCCQ pad 1056. Metal interconnect layer M0 includes metal plate 1052 connected to VSS pad 1052. Metal interconnect layer MX includes metal plate 1054 connected to VCCQ pad 1056. There are two capacitors formed by the structure of FIG. 9F: (1) a first capacitor comprising metal plate 1050 and metal plate 1052 and (2) a second capacitor comprising metal plate 1052 and metal plate 1054. VSS pad 1058 and VCCQ pad 1056 are part of one embodiment of I/O interface 510.

FIG. 9G is a top view of three metal interconnect layers M1, M0 and MX for another embodiment where capacitors include a first metal component in a first metal interconnect layer below a signal line and a second metal component in a second metal interconnect layer below the signal line. Metal interconnect layer M1 includes metal plate 1070 connected to VSS pad 1076. Metal interconnect layer M0 includes metal plate 1072 connected to VCCQ pad 1078. Metal interconnect layer MX includes metal plate 1074 connected to VSS pad 1080. There are two capacitors formed by the structure of FIG. 9G: (1) a first capacitor comprising metal plate 1070 and metal plate 1072 and (2) a second capacitor comprising metal plate 1072 and metal plate 1074. VSS pad 1076 and VCCQ pad 1078 are part of one embodiment of I/O interface 510.

FIG. 9H is a top view of three metal interconnect layers M1, M0 and MX for another embodiment where capacitors include a first metal component in a first metal interconnect layer below a signal line and a second metal component in a second metal interconnect layer below the signal line. The embodiment of FIG. 9H also includes capacitors having two metal components in a single metal interconnect layer. Metal interconnect layer M1 includes metal plate 1086 connected to VSS pad 1092. Metal interconnect layer M0 includes metal mesh 1088 connected to VCCQ pad 1094. Metal interconnect layer MX includes two metal interleaved metal combs 1096 and 1098 having interdigitated fingers. Metal comb 1098 is connected to VSS pad 1092. Metal comb 1098 is connected to VCCQ pad 1094. VSS pad 1092 and VCCQ pad 1094 are part of one embodiment of I/O interface 510. There are three capacitors formed by the structure of FIG. 9H: (1) a first capacitor comprising metal plate 1086 and metal mesh 1088, (2) a second capacitor comprising metal mesh 1088 and metal comb 1096, and (3) a third capacitor comprising metal comb 1096 and metal comb 1094.

Figure 10:
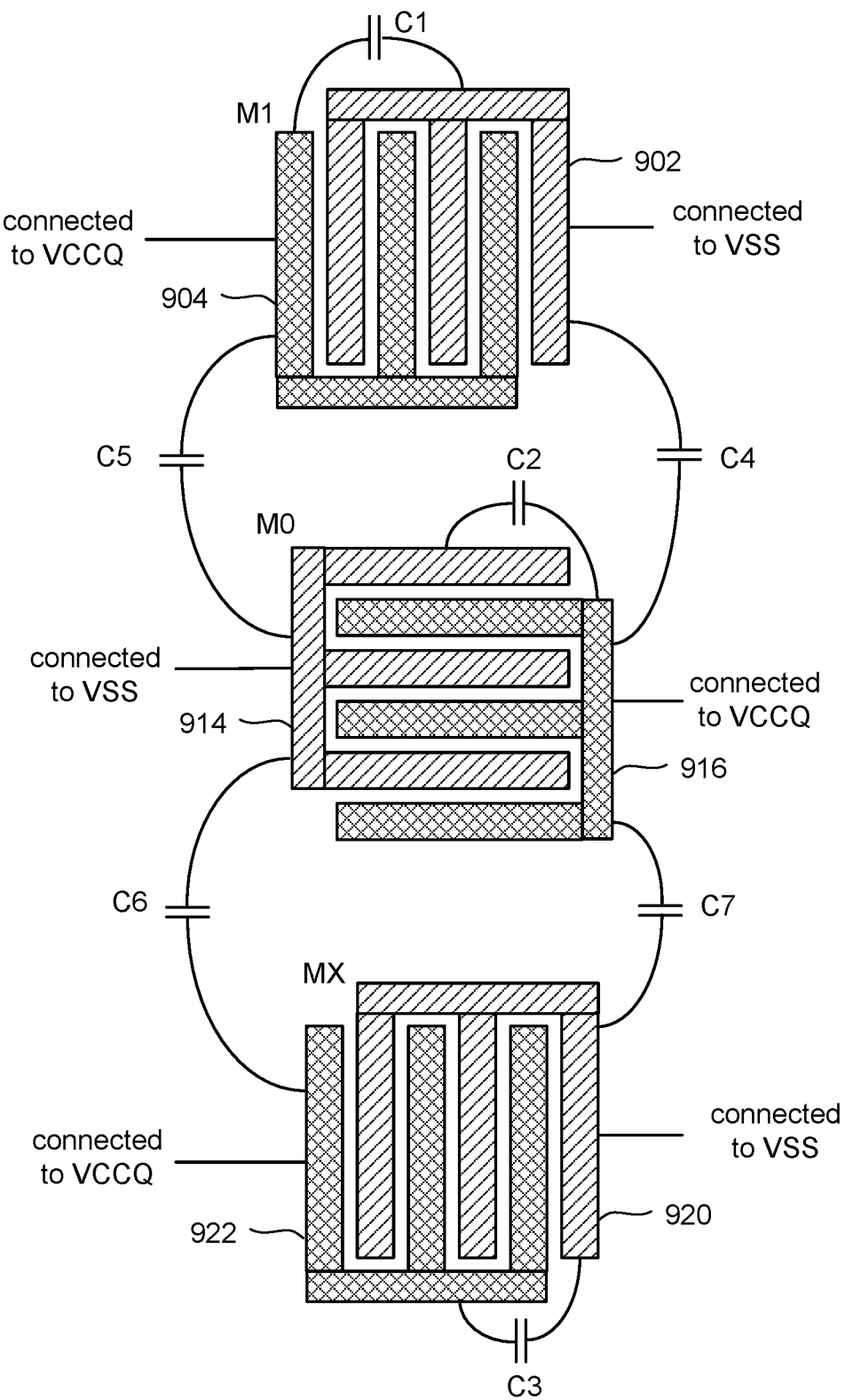
FIG. 10 is a top view of three metal layers, showing the various capacitors implemented.

FIG. 10 is a top view of three metal layers, showing the various capacitors implemented for the embodiment of FIG. 9A. There are seven capacitors formed by the structure depicted in FIGS. 9A and 10: (1) a first capacitor C1 comprising metal comb 902 and metal comb 904, (2) a second capacitor C2 comprising metal comb 914 and metal comb 916, (3) a third capacitor C3 comprising metal comb 920 and metal comb 922, (4) a fourth capacitor C4 comprising metal comb 902 and metal comb 916, (5) a fifth capacitor C5 comprising metal comb 904 and metal comb 914, (6) a sixth capacitor C6 comprising metal comb 914 and metal comb 922, and (7) a seventh capacitor comprising metal comb 916 and metal comb 920. There can also be an eighth capacitor comprising metal comb 920 or metal comb 922 in combination with a metal component on active area AA of the substrate (e.g., such as part of the electrical components described above).

Figure 11:
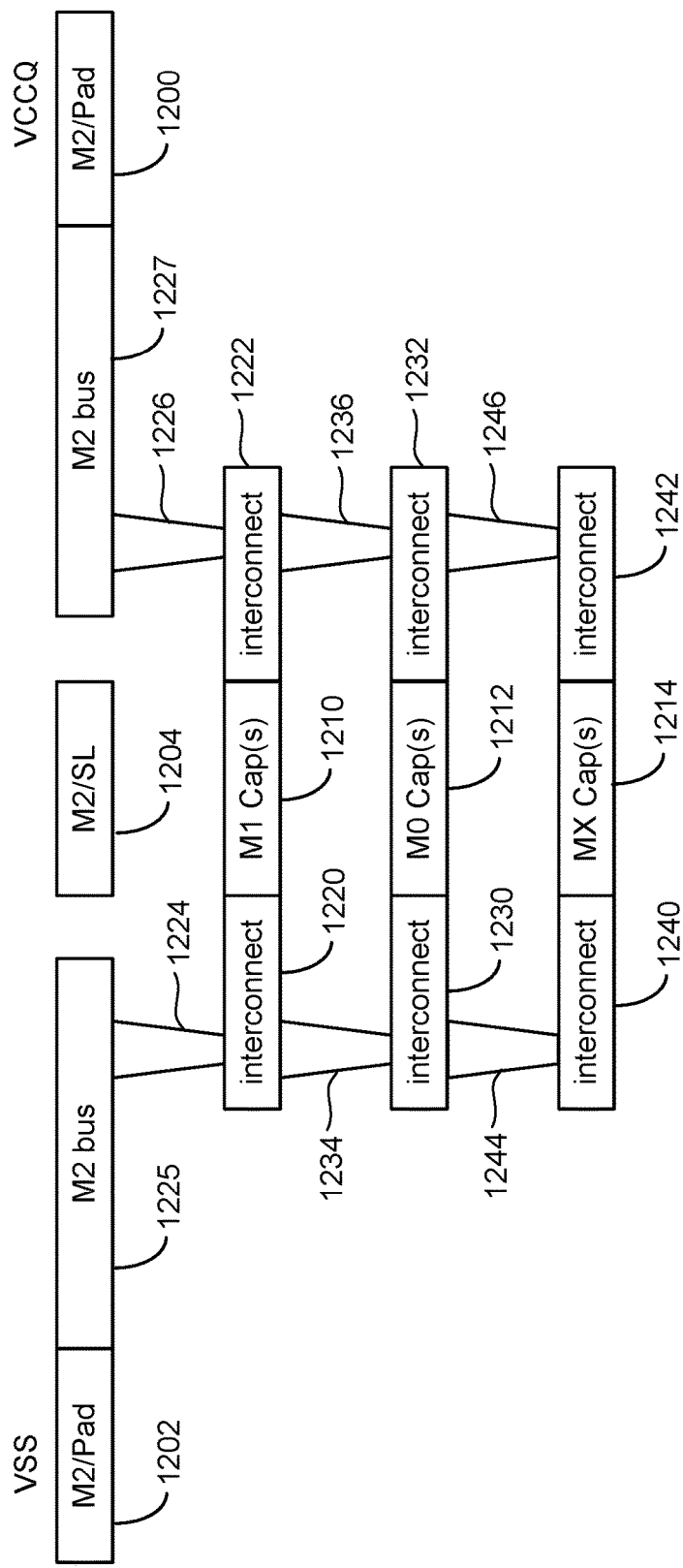
FIG. 11 is a cross sectional view of a portion of a memory die.
Figure 11:
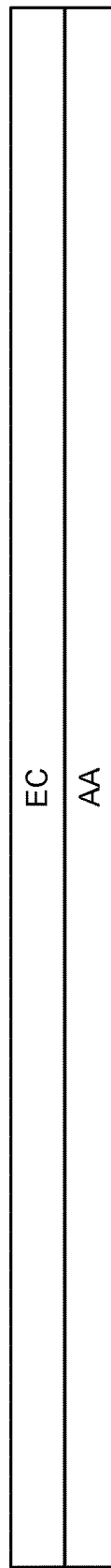

FIGS. 7A-9H show various embodiments of metal components in the metal interconnect layers forming capacitors that are connected to VSS and VCCQ. One skilled in the art would know how to connect the depicted metal components to VSS and VCCQ using metal interconnect, vias and other signal lines. FIG. 11 is a cross sectional view of a portion of the memory die that shows one example of connecting the depicted metal components to VSS and VCCQ. FIG. 11 depicts VCCQ pad 1200, VSS pad 1202 and signal line 1204, all three of which are implemented in metal interconnect layer M2 and are part of one embodiment of I/O Interface 510. FIG. 11 also shows M1 capacitor(s) 1210, M0 capacitor(s) 1212, and M1 capacitor(s) 1214. M1 capacitor(s) 1210 comprises one or more metal components on metal interconnect layer M1 that comprise one or more capacitors as discussed above. M0 capacitor(s) 1212 comprises one or more metal components on metal interconnect layer M0 that comprise one or more capacitors as discussed above. MX capacitor(s) 1214 comprises one or more metal components on metal interconnect layer MX that comprise one or more capacitors as discussed above.

Metal interconnect layer M1 includes metal interconnect 1220 that connects one or more metal components 1210 on metal interconnect layer M1 to via 1224, which connects to M2 bus 1225, which connects to VSS pad 1202; thereby, connecting a capacitor that is partially or fully implemented on metal interconnect layer M1 to VSS pad 1202. Metal interconnect layer M1 also includes metal interconnect 1222 that connects one or more metal components 1210 on metal interconnect layer M1 to via 1226, which connects to M2 bus 1227, which connects to VCCQ pad 1200; thereby, connecting a capacitor that is partially or fully implemented on metal interconnect layer M1 to VCCQ pad 1200. M2 bus 1225 and M2 bus 1227 are metal signal lines on metal interconnect layer M2.

Metal interconnect layer M0 includes metal interconnect 1230 that connects one or more metal components 1212 on metal interconnect layer M0 to via 1234, which connects to metal interconnect 1220; thereby, connecting a capacitor that is partially or fully implemented on metal interconnect layer M0 to VSS pad 1202. Metal interconnect layer M0 also includes metal interconnect 1232 that connects one or more metal components 1212 on metal interconnect layer M0 to via 1236, which connects to metal interconnect 1222; thereby, connecting a capacitor that is partially or fully implemented on metal interconnect layer M0 to VCCQ pad 1200.

Metal interconnect layer MX includes metal interconnect 1240 that connects one or more metal components 1214 on metal interconnect layer MX to via 1244, which connects to metal interconnect 1230; thereby connecting a capacitor that is partially or fully implemented on metal interconnect layer MX to VSS pad 1202. Metal interconnect layer MX also includes metal interconnect 1242 that connects one or more metal components 1214 on metal interconnect layer MX to via 1246, which connects to metal interconnect 1232; thereby, connecting a capacitor that is partially or fully implemented on metal interconnect layer MX to VCCQ pad 1200. FIG. 11 also depicts electrical components EC implemented on the active area AA of the substrate, below the various metal layers discussed above so that the capacitors are positioned below the signal line and above electrical components (e.g., device capacitors) located on the substrate.

Figure 12:
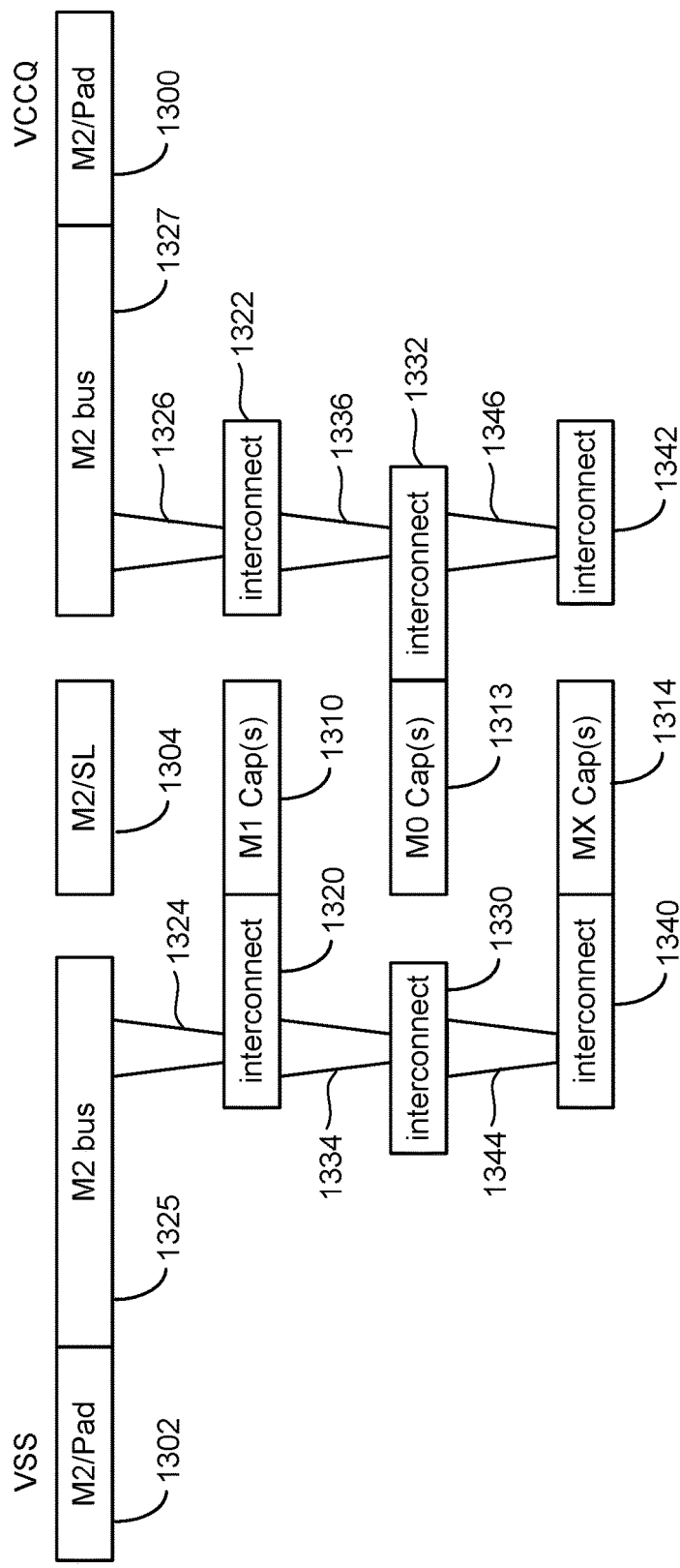
FIG. 12 is a cross sectional view of a portion of a memory die.
Figure 12:
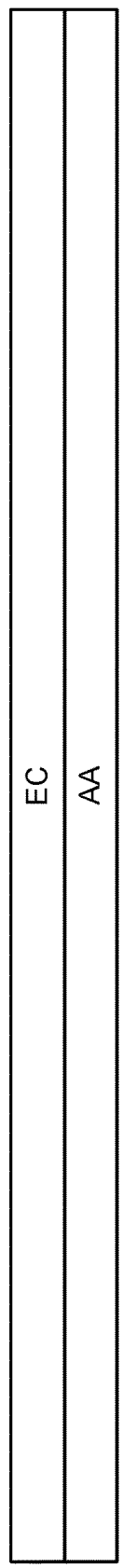

FIG. 12 is a cross sectional view of a portion of the memory die that shows another example of connecting the depicted metal components to VSS and VCCQ. FIG. 12 depicts VCCQ pad 1300, VSS pad 1302 and signal line 1304, all three of which are implemented in metal interconnect layer M2 and are part of one embodiment of I/O Interface 510. FIG. 12 also shows M1 capacitor(s) 1310, M0 capacitor(s) 1313, and M1 capacitor(s) 1314. M1 capacitor(s) 1310 includes one or more metal components on metal interconnect layer M1 that comprise a portion of one or more capacitors as discussed above. M0 capacitor(s) 1313 includes one or more metal components on metal interconnect layer M0 that comprise a portion of one or more capacitors as discussed above. MX capacitor(s) 1314 includes one or more metal components on metal interconnect layer MX that comprise a portion of one or more capacitors as discussed above.

Metal interconnect layer M1 includes metal interconnect 1320 that connects one or more metal components 1310 on metal interconnect layer M1 to via 1324, which connects to M2 bus 1325, which connects to VSS pad 1302; thereby, connecting a capacitor that is partially implemented on metal interconnect layer M1 to VSS pad 1302. Metal interconnect layer M0 includes metal interconnect 1332 that connects one or more metal components 1313 on metal interconnect layer M0 to via 1336, which connects to metal interconnect 1322, which connects to via 1326, which connects to M2 bus 1327, which connects to VCCQ pad 1300; thereby, connecting a capacitor that is partially implemented on metal interconnect layer M0 to VCCQ pad 1300. Metal interconnect layer MX includes metal interconnect 1340 that connects one or more metal components 1314 on metal interconnect layer MX to via 1344, which connects to metal interconnect 1330, which connects to via 1334, which connects to metal interconnect 1320; thereby connecting a capacitor that is partially implemented on metal interconnect layer MX to VSS pad 1202. FIG. 12 also depicts electrical components EC implemented on the active area AA of the substrate, below the various metal layers discussed above so that the capacitors are positioned below the signal line and above electrical components (e.g., device capacitors) located on the substrate. The technology described herein can include means for connecting capacitors to I/O pads in addition to those means depicted in FIGS. 11 and 12.

The above discussion teaches a means for converting unused portions of the memory die to usable capacitors for the power I/O pad. This technology can also be used to provide capacitors for other I/O pads or other types of I/O interfaces. Additionally, the proposed technology can be used on semiconductors dies other than memory dies. This technology improves signal timing issues in the circuit (including at the interface of the memory die), without adding to the size of the memory die or taking space away from other components on the memory die.

One embodiment includes an apparatus comprising an electrical circuit; a plurality of metal interconnect layers connected to the electrical circuit; a signal line connected to the electrical circuit; a plurality of I/O connections in communication with the electrical circuit, the I/O connections include a power I/O connection; and a first capacitor connected to the power I/O connection. The first capacitor is positioned in one or more of the metal interconnect layers. The first capacitor is positioned below the signal line.

One example implementations further comprises a three dimensional non-volatile memory array (e.g., see FIGS. 2-3F) formed above the substrate and below the metal interconnect layers. The memory array is connected to the electrical circuit. The memory array is in communication with the I/O connections.

One embodiment includes an apparatus comprising a substrate; a plurality of metal interconnect layers above the substrate; a device capacitor positioned on a top surface of the substrate and below the plurality of metal interconnect layers; a three dimensional non-volatile memory array formed above the substrate and below the metal interconnect layers; an I/O pad; and multiple capacitors connected to the I/O pad. The capacitors are positioned in the metal interconnect layers. At least one of the multiple capacitors is positioned above the device capacitor.

One embodiment includes an apparatus comprising a substrate; a plurality of metal interconnect layers above the substrate; a three dimensional non-volatile memory array formed above the substrate and below the metal interconnect layers; a peripheral circuit connected to the memory array; a plurality of I/O pads positioned above the substrate and connected to the peripheral circuit (the I/O pads include a power I/O pad, a ground I/O pad and data/control I/O pads; and a plurality of metal components positioned in the metal interconnect layers above the substrate. Pairs of the metal components form capacitors. Each pair of metal components includes one metal component connected to the power I/O pad and one metal component connected to the ground I/O pad.

For purposes of this document, I/O can refer to input only, output only, or both input and output.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a semiconductor die, comprising:
 a substrate;
 a three dimensional non-volatile memory array formed above the substrate;
 a plurality of metal interconnect layers configured to route signals within the semiconductor die, the plurality of metal interconnect layers are positioned above the substrate, above the three dimensional non-volatile memory array and across a top area of the semiconductor die;
 electrical components, including a device capacitor, positioned in the semiconductor die on a top surface of the substrate and below the plurality of metal interconnect layers, the metal interconnect layers are electrically connected to the electrical components below the plurality of metal interconnect layers;
 an I/O pad; and
 multiple capacitors connected to the I/O pad, the multiple capacitors are positioned in the metal interconnect layers, at least one of the multiple capacitors is positioned directly above the device capacitor in the semiconductor die.

2. The apparatus of claim 1, further comprising:
a signal line connected to the electrical components, the multiple capacitors are positioned directly below the signal line.

3. The apparatus of claim 1, wherein:
the I/O pad is a power I/O pad.

4. The apparatus of claim 3, further comprising:
a ground I/O pad, the multiple capacitors are also connected to the ground I/O pad.

5. The apparatus of claim 1, wherein:
at least one of the multiple capacitors comprises two metal components in a single metal interconnect layer of the plurality of metal interconnect layers.

6. The apparatus of claim 5, wherein:
the two metal components are shaped as interleaved combs.

7. The apparatus of claim 5, wherein:
the two metal components have interdigitated fingers.

8. The apparatus of claim 1, wherein:
the metal interconnect layers include a first metal interconnect layer and a second metal interconnect layer below the first metal interconnect layer; and
at least one of the multiple capacitors comprises a pair of metal components that includes a first metal component in the first metal interconnect layer and a second metal component in the second metal interconnect layer.

9. The apparatus of claim 8, wherein:
the first metal component is a mesh.

10. The apparatus of claim 8, wherein:
the first metal component is a metal plate.

11. The apparatus of claim 8, wherein:
the first metal component is comb shaped.

12. The apparatus of claim 4, wherein:
the multiple capacitors comprise a first capacitor, a second capacitor, a third capacitor and a fourth capacitor;
the plurality of metal interconnect layers includes a first metal interconnect layer having a first metal interconnect layer region and a second metal interconnect layer having a second metal interconnect layer region;
the first metal interconnect layer region includes a first metal component connected to the ground I/O pad and a second metal component connected to the power I/O pad;

the second metal interconnect layer region includes a third metal component connected to the power I/O pad and a fourth metal component ground I/O pad;
the first capacitor comprises the first metal component and the second metal component;
the second capacitor comprises the third metal component and the fourth metal component;
the third capacitor comprises the first metal component and the third metal component; and
the fourth capacitor comprises the second metal component and the fourth metal component.

* * * * *